(12) United States Patent
Yasuda

(10) Patent No.: US 9,418,815 B2
(45) Date of Patent: Aug. 16, 2016

(54) TUBULAR PERMANENT MAGNET USED IN A MULTI-ELECTRON BEAM DEVICE

(71) Applicant: PARAM CORPORATION, Tokyo (JP)

(72) Inventor: Hiroshi Yasuda, Hasuda (JP)

(73) Assignee: PARAM CORPORATION, Tokyo (JP)

( * ) Notice: Subject to any disclaimer, the term of this patent is extended or adjusted under 35 U.S.C. 154(b) by 42 days.

(21) Appl. No.: 14/271,940

(22) Filed: May 7, 2014

(65) Prior Publication Data

US 2014/0252245 A1    Sep. 11, 2014

Related U.S. Application Data

(63) Continuation of application No. 13/814,190, filed as application No. PCT/JP2011/074588 on Oct. 25, 2011, now abandoned.

(30) Foreign Application Priority Data

Oct. 27, 2010    (JP) ................. 2010-240408

(51) Int. Cl.
*H01J 37/30* (2006.01)
*H01J 3/24* (2006.01)
*B82Y 10/00* (2011.01)
(Continued)

(52) U.S. Cl.
CPC . *H01J 3/24* (2013.01); *B82Y 10/00* (2013.01); *B82Y 40/00* (2013.01); *H01J 3/20* (2013.01); *H01J 37/143* (2013.01); *H01J 37/3007* (2013.01); *H01J 37/3174* (2013.01);
(Continued)

(58) Field of Classification Search
CPC . H01J 37/143; H01J 37/3007; H01J 37/3177; H01J 3/24
See application file for complete search history.

(56) References Cited

U.S. PATENT DOCUMENTS

| 2,853,657 A | 9/1958 | Hofacker |
| 3,164,739 A | 1/1965 | Heinz |

(Continued)

FOREIGN PATENT DOCUMENTS

| CN | 1404617 A | 3/2003 |
| CN | 1996547 A | 7/2007 |

(Continued)

OTHER PUBLICATIONS

European Search Report dated Apr. 8, 2014, as issued in corresponding Europe Patent Application No. 11836299.5.

(Continued)

*Primary Examiner* — Robert Kim
*Assistant Examiner* — Sean Luck
(74) *Attorney, Agent, or Firm* — Muncy, Geissler, Olds & Lowe, P.C.

(57) ABSTRACT

There provided a device for effectively drawing a fine pattern using a permanent magnet. The device has an outer cylinder 201 composed of a cylindrical ferromagnet with a Z axis as a central axis, a cylindrical permanent magnet 202 located inside the outer cylinder and polarized along the Z axis direction, a correction coil 204 located inside the cylindrical permanent magnet with a gap from the cylindrical permanent magnet, for adjusting a magnetic field strength generated by the cylindrical permanent magnet along the Z axis direction, and a coolant passage 203 located in the gap between the cylindrical permanent magnet and the correction coil, for allowing a coolant to flow therethrough and controlling temperature changes in the cylindrical permanent magnet.

4 Claims, 16 Drawing Sheets

(51) Int. Cl.
*B82Y 40/00* (2011.01)
*H01J 37/143* (2006.01)
*H01J 37/317* (2006.01)
*H01J 3/20* (2006.01)

(52) U.S. Cl.
CPC ....... *H01J37/3177* (2013.01); *H01J 2237/002* (2013.01); *H01J 2237/1405* (2013.01)

(56) References Cited

U.S. PATENT DOCUMENTS

| | | |
|---|---|---|
| 3,336,526 A | 8/1967 | Weaver, Jr. et al. |
| 4,433,270 A | 2/1984 | Drozdov et al. |
| 4,731,598 A | 3/1988 | Clarke |
| 4,806,766 A | 2/1989 | Chisholm |
| 4,975,668 A | 12/1990 | Nishinuma |
| 5,548,183 A | 8/1996 | Miyoshi et al. |
| 7,214,951 B2 | 5/2007 | Stengl et al. |
| 7,262,418 B2 | 8/2007 | Lo et al. |
| 2003/0089859 A1 | 5/2003 | Adamec |
| 2008/0067396 A1 | 3/2008 | Ohshima et al. |
| 2011/0148297 A1 | 6/2011 | Yasuda et al. |

FOREIGN PATENT DOCUMENTS

| | | |
|---|---|---|
| EP | 1 970 935 A1 | 9/2008 |
| JP | 60245132 A | 12/1985 |
| JP | 63-244546 A | 10/1988 |
| JP | 05128986 A | 5/1993 |
| JP | 2007-311117 A | 11/2007 |
| WO | WO 03/081286 A2 | 10/2003 |
| WO | WO 2009/157054 A1 | 12/2009 |

OTHER PUBLICATIONS

Office Action dated May 5, 2015, as issued in corresponding Chinese Patent Application No. 201180037664.X (14 pages).

TUBULAR PERMANENT MAGNET USED IN A MULTI-ELECTRON BEAM DEVICE

CROSS-REFERENCE TO RELATED APPLICATIONS

This application is a continuation of co-pending application Ser. No. 13/814,190, filed on Feb. 4, 2013, for which priority is claimed under 35 U.S.C. §120; which is a 371 of International Application No. PCT/JP2011/074588, filed on Oct. 25, 2011, and which claims priority of Application No. 2010-240408 filed in Japan on Oct. 27, 2010, under 35 U.S.C. §119; and the entire contents of all of which are hereby incorporated by reference.

TECHNICAL FIELD

The present invention relates to an electron beam device such as an electron lens, a multicolumn electron beam drawing device, or an electron beam inspection device in the electron beam drawing technology utilized in the field of lithography for drawing circuit patterns in the semiconductor (LSI) manufacturing process.

BACKGROUND ART

To date, the semiconductor lithography technology has contributed to miniaturization, high integration, and cost reduction by light-based photoengraving. Based on the principle that resolution is improved as optical wavelength becomes shorter, light wavelength has become shorter and shorter with the progress of miniaturization, and there has been a transition from g ray (a wavelength of 436 nm) to i ray (a wavelength of 365 nm), and, at present, excimer laser light having a wavelength of 193 nm is used. Lithography technology using extremely short ultraviolet ray (EUV) having a further shorter wavelength, a wavelength of 13.5 nm, has continued to be developed aggressively.

However, in light-based photoengraving, a mask equivalent to a negative is required without exception. With the advance of miniaturization of semiconductors, the cost of the development of masks has continued to increase, reaching as much as several million yen per type of LSI. Meanwhile, the electron beam drawing device has been used in the development of the masks due to its feature of having a pattern generating function. However, with the advance of optical lithography technology, processing time has increased due to the introduction of super-resolution technology which realizes transcription at a degree of optical wavelength or smaller and the increased amount of mask data generated in association with the high integration. As a result, processing time of drawing a mask needs dozens of hours per single layer of a mask.

As such, for the purposes of reducing the escalating cost of masks through reduction of processing time of drawing a mask and realizing direct drawing by an electron beam drawing device without expensive masks, there has been proposed a multibeam device employing a plurality of electron beams, in order to improve the processing capacity of the electron beam drawing device per unit time. There has been demand for achieving processing capacity which is more than dozens of times the current processing capacity.

There are basically two methods of generating a plurality of electron beams. The first method is a split-and-shape type in which only a single electron gun is used and electrons output from the electron gun are caused to pass through a structure (splitter) having numerous holes, thereby shaping them into a plurality of electron beams, while the second method is of a multiple electron gun type in which an electron gun is provided for each electron beam performing exposure processing.

In the electron beam splitting and shaping drawing method, because the intervals in the splitter are of the order of micrometers, it is impossible to control the strength of the electron beams entering the respective holes to render them uniform and perform adjustment of an axis and determination of a deflection position for each split electron beam, and therefore, there is adopted a scheme in which a single electron optical lens barrel (column) is employed for a plurality of electron beams and only on and off of the electron beams is controlled separately to obtain drawing patterns. However, this scheme has a disadvantage in that the strength of the individual split beams cannot be adjusted with the accuracy required for drawing, and therefore, it is impossible to perform drawing with a high degree of accuracy.

Further, because electrons of beams in a single column have the same negative charge, the electron repulsion phenomenon occurs due to Coulomb repulsive force if the total amount of electrons is large, and beam defocus becomes prominent. Therefore, the amount of available electrons must be limited to, for example, several microamperes. Multibeam technology has also drawn attention as a technology for overcoming this limitation of the processing capacity per electron beam.

Meanwhile, in the multiple electron gun type, because the size of an electron gun is from one to two centimeters, and because a plurality of electron optical lens barrels (referred to as columns) are provided independently for the respective electron beams, this type is referred to as a multicolumn system and has a structure composed of a bundle of dozens of single element columns.

In the multicolumn system, because it is possible to individually control parameters that affect drawing accuracy, such as the strength of a beam, a radiation angle, and current density, it is easy to perform drawing accurately. Because there are a plurality of independent columns, it is possible to perform exposure using an electron beam of greater than or equal to several dozen microamperes in total, and therefore, it is possible to dramatically improve processing capacity and expose several dozens of silicon wafers per hour, even if the total power of electron beams is limited to several microamperes in response to beam defocus due to Coulomb repulsive force.

The conventional electron beam drawing device employing a single column has a processing capacity of 0.1 to 0.2 sheets per hour. In order to realize a processing capacity of 10 to 20 sheets per hour by the multicolumn system in which a plurality of columns are arranged in parallel, it is necessary to arrange approximately 100 columns in a 300 mm wafer. In this case, it is necessary to arrange the columns in rectangular or square-shaped lattice coordinates. For example, it is necessary to arrange 132 or 120 of columns in a 300 mm circle if a single cell is a square lattice of 25 mm. The required number of multiple columns is based on the demand for the processing capacity.

In order to place the columns at pitches of approximately 25 mm, the thickness of a single column has to be smaller than or equal to approximately 25 mm at maximum. This means that the electron lens has to have a diameter smaller than or equal to approximately 23 mm at maximum.

There are electrostatic-type electron lenses and electromagnetic-type electron lenses. It is easy to manufacture an electrostatic electron lens having a diameter smaller than or equal to 23 mm. Further, electrostatic lenses are suitable for the multicolumn system, as potentials of all lenses are easy to match. However, the electrostatic lenses are not suitable to constitute the electron beam drawing device. This is because the electron beam drawing device frequently uses an electrostatic deflector for the reason that the electrostatic deflector can deflect electron beams at high speed. An electromagnetic deflector available as another deflector option is rarely used in a high-speed drawing device because the deflector takes a long time to switch positions of an electron beam due to the problems of eddy current and inductance.

In the electron beam drawing device which frequently uses a high-speed electrostatic deflector, electric field interference tends to occur between the electrostatic deflector and the electrostatic lens, and the axial symmetry of the lens electric field tends to be easily lost. Therefore, it is impossible to form beams accurately by the lens. In order to avoid this, it is necessary to separate the electrostatic deflector sufficiently far from the electrostatic lens along the beam axis direction. For these reasons, it is impossible to use the electrostatic lens in the drawing device in which the distance between the electrostatic deflector and the electrostatic lens is short. If the distance between the electrostatic deflector and the electrostatic lens becomes longer, a column becomes longer and beam defocus increases due to Coulomb repulsive force, and therefore, it is necessary to limit the upper limit of the total power of available electron beam to be small. Therefore, the processing capacity of the electron beam drawing device becomes smaller. As such, it is impossible to use the electrostatic lens in the electron beam drawing device which aims at high speed wafer drawing processing.

Because of the reasons described in the above section, it is essential to use the electromagnetic lens as the electron lens, in order to enhance processing capacity. In the electron beam drawing device, the electromagnetic lens employing an electromagnet has been used. However, if, in the multicolumn system, the number of columns increases from a few to more than several dozen columns, a large amount of Joule heat is generated by a current flowing in the electromagnet, and a vast amount of power from several hundred W to several kW is generated. Such a multicolumn system is unrealistic.

Here, use of a permanent magnet in place of the electromagnet is considered. However, only using the permanent magnet is not enough to make an electron lens suitable for the multicolumn system. Although, generally, strong permanent magnets employing rare earth elements such as samarium cobalt and neodymium are now available as permanent magnets, they tend not to be polarized uniformly and therefore are not easily used in an electron lens which needs to be axially symmetric in a uniform manner. The conventional publicly-known examples employ, for example, as shown in Patent Document 1 and FIG. 5, a ring-shaped permanent magnet which has a large radius and is located apart from the axis inside the pole piece having a large circumference. In most cases, an electron lens magnetic pole gap between pole pieces made of a ferromagnetic material is brought sufficiently closer to the beam axis. In doing so, it is possible to smooth the non-uniformity of permanent magnet by the ferromagnet to thereby form a lens magnetic field having sufficient axial symmetry in the vicinity of the pole piece.

However, with the electron lens employing the permanent magnet having the above-described shape, it is impossible to form a lens suitable for the multicolumn system. The lens suitable for the multicolumn system needs to have at least a large space in the lens in which an electrostatic deflector having a diameter greater than or equal to several millimeters can be installed. In addition, the lens has to have an electrostatic deflection field capable of being overlapped with a focused magnetic field. This is because these are critical conditions for achieving reduction of beam defocus due to the Coulomb effect and achieving reduction of focus and deflection aberration.

Further, in order to arrange more than several dozens of columns on the 300 millimeter wafer, the lens must have an outer diameter smaller than or equal to 23 millimeters. It is impossible to modify the electron lens employing the permanent magnet having the above-described shape to have an outer diameter smaller than or equal to 23 mm.

As such, there has been no magnetic field-type electromagnetic lens suitable for the multicolumn system. Therefore, it has been impossible to realize a multicolumn electron beam drawing device having more than several dozens of columns with high resolution and low power consumption.

Further, the electron beam drawing device often uses a variable rectangular beam and cell projection (hereinafter abbreviated as CP). The former deflects an electron beam image between the first rectangular aperture and the second rectangular aperture to thereby change the height and width of the rectangular beam as desired. The latter forms, as a CP pattern, a partial pattern included in a cell in a pattern used as an LSI pattern, in a form of a perforated mask on a silicone mask pattern, emits a beam to rectangular portions in a predetermined region on the CP mask in a selective manner, and performs beam molding according to the perforated mask, thereby performing partial collective transfer. Further, the electron beam drawing device may also adopt a multicolumn, multibeam system in which drawing is performed by determining an ON/OFF state of several hundreds to several thousands of individual beams in a single column using bitmap.

The electron beam drawing device which uses only a Gaussian spot beam but does not employ these techniques has not been able to attain sufficient drawing processing capacity even if it is formed as the multicolumn type electron beam drawing device. Therefore, in order to realize a high-speed drawing device, it is essential to form multiple columns while employing the variable rectangular beam, cell projection, and multibeam. There has been demand for realization of such an electron optical system with an electromagnetic lens having an outer diameter smaller than or equal to 23 millimeters.

Patent Document 1 discloses an example of an electron lens employing a permanent magnet (FIG. 5). With this electron lens, reduction of power consumption can be achieved. However, with this electron lens, even if an attempt is made to arrange a plurality of lenses for the multicolumn arrangement, it is impossible to arrange many lenses, and it is therefore impossible to create a high-throughput multibeam type-electron beam drawing device. Further, it is impossible to achieve temperature stability and positional stability of focus and radiation for the individual beams.

CITATION LIST

Patent Literature

Patent Literature 1 JP 2007-311117 A

SUMMARY OF INVENTION

Technical Problem

As described above, in the electron beam multiple columns, it is impossible to use the electrostatic lens due to the interference problem by the electrostatic deflector. Although the electromagnetic lens can be used, if all lenses for more than dozens of columns are composed of magnet coils, a vast amount of heat is generated, and a crash will occur.

As has long been known, by manufacturing an electromagnetic lens employing a permanent magnet, it is possible to control an amount of heat generation in a single lens. Reference 1 also shows an example of an electron lens employing a permanent magnet (FIG. 5). However, with a method of forming a magnetic field along one direction in the vicinity of the beam axis so as to wrap a permanent magnet using a pole piece which is made of a ferromagnetic material and has a large outer diameter and a small inner diameter, it is impossible to form a lens having a thickness smaller than or equal to 23 mm, which is the thickness necessary to arrange dozens of lenses in a parallel arrangement, which arrangement is necessary to obtain the processing capacity of more than ten 300 mm silicone wafers per hour. Even if it is possible to make the outer diameter smaller, it is impossible to form, inside the pole piece, a nonmagnetic space which is sufficiently large to install the electrostatic deflector in a lens magnetic field.

Further, although, when making an electromagnetic lens employing a permanent magnet, the permanent magnet itself does not generate heat, it is necessary to install a correction coil for strength adjustment in the vicinity of the permanent magnet and cause a current to flow therethrough so as to adjust the permanent magnet to have the strength necessary for the electromagnetic lens.

Solution to Problem

The present invention provides an electron lens used in an electron beam device having an electron gun emitting an electron beam in a Z axis direction, and the electron lens has an outer cylinder composed of a cylindrical ferromagnet with the Z axis as a central axis, a cylindrical permanent magnet located inside the outer cylinder and polarized along the Z axis direction, a correction coil located inside or outside the cylindrical permanent magnet with a gap from the cylindrical permanent magnet, for adjusting a magnetic field strength generated by the cylindrical permanent magnet along the Z axis direction, and a coolant passage located in the gap between the permanent magnet and the correction coil, for allowing a coolant to flow therethrough and controlling temperature changes in the cylindrical permanent magnet.

It is also preferable to install, on an end surface of an electron beam emission side of the cylindrical permanent magnet along the Z axis direction, a thin ferromagnetic ring which homogenizes a magnetic field generated by the cylindrical permanent magnet.

It is also preferable that the cylindrical permanent magnet includes a first cylindrical permanent magnet located on an electron beam incoming side and a second cylindrical permanent magnet located on the electron beam emission side, both cylindrical permanent magnets being aligned along the Z axis direction; the first cylindrical permanent magnet and the second cylindrical permanent magnet are polarized so as to generate magnetic fields in opposite directions; the first cylindrical permanent magnet has a larger inner diameter than the second cylindrical permanent magnet; and that a central magnetic field generated by the second cylindrical permanent magnet is overlapped with a central magnetic field generated by the first cylindrical permanent magnet.

It is also preferable that the coolant passage has a cylindrical passage located in the gap.

It is also preferable that the electron beam device according to the present invention has a plurality of electron lens arranged on a plane generally orthogonal to the Z axis and emits a plurality of electron beams to a sample.

Further, the electron beam device has a feature that, in order to enhance processing capacity, there is provided a plurality of radially thin-walled cylindrical, magnetic field-type electron lenses in parallel to the traveling direction of the electron beam, and at least one stage of lens for focusing an electron beam to form an image has a ferromagnet composed of a radially thin-walled cylindrical ferromagnet located as an outer circumference with a Z axis as a central axis, a radially thin-walled cylindrical permanent magnet located inside the radially thin-walled cylindrical ferromagnet located as the outer circumference, polarized along the radial direction, and having a length smaller than or equal to approximately half that of the radially thin-walled cylindrical ferromagnet, and a radially thin-walled cylindrical ferromagnet located inside the radially thin-walled cylindrical permanent magnet and having a length approximately equal to or larger than that of the thin-walled cylindrical permanent magnet.

It is preferable to use a permanent magnet as a component for generating a main magnetic field for an electron lens, install a correction coil for adjusting the strength in the vicinity of the permanent magnet in order to cause the strength to accurately match the strength required for a desired electromagnetic lens, to thereby cause a current to flow, and fill a liquid in a space including the permanent magnet and circulate the liquid therethrough, in order to reduce temperature changes due to Joule heat and changes in strength of the permanent magnet caused by the temperature changes, to thereby maintain a constant level of temperature of the whole liquid and stabilize the magnetic field strength of the permanent magnet.

Advantageous Effects of Invention

With the present invention, it is possible to construct an electron lens employing a permanent magnet polarized along the axis direction and reduce the adverse effects caused by heat generated by the correction coil.

In addition, because a magnetic field generated by a radially thin-walled cylindrical permanent magnet, which is polarized along the radial direction with the electron beam axis as the central axis, can form a magnetic field-type electron lens with little power consumption and form an electron lens having a diameter smaller than or equal to 23 mm, it is possible to manufacture a high-speed electron beam drawing device which draws more than ten 300 mm wafers per hour. Further, by stabilizing a temperature of Joule heat generated by the magnetic field strength adjustment coil using a liquid, it is possible to provide an electron beam drawing device having stable permanent magnet strength and stable lens strength.

DESCRIPTIONS OF EMBODIMENTS

Embodiments of the present invention will be described with reference to the drawings.

First Embodiment

In a multicolumn electron beam device using a plurality of electron beams which dramatically improves the processing capacity of electron beam drawing technology utilized in the field of lithography for drawing circuit patterns in the semiconductor (LSI) manufacturing process, the present invention relates to an electron lens employing a permanent magnet which can have a lens configuration having a fine diameter and which enables low power consumption and high-precision drawing, and to a multicolumn electron beam drawing device employing this electron lens. Although the lens technology as the central technology can also be used in an electron beam inspection device in a similar manner and can also be applied to a multicolumn electron beam inspection device as the effect of the lens technology can also be faster by the parallel arrangement, the electron beam drawing device will be mainly described in detail.

Figure 1:
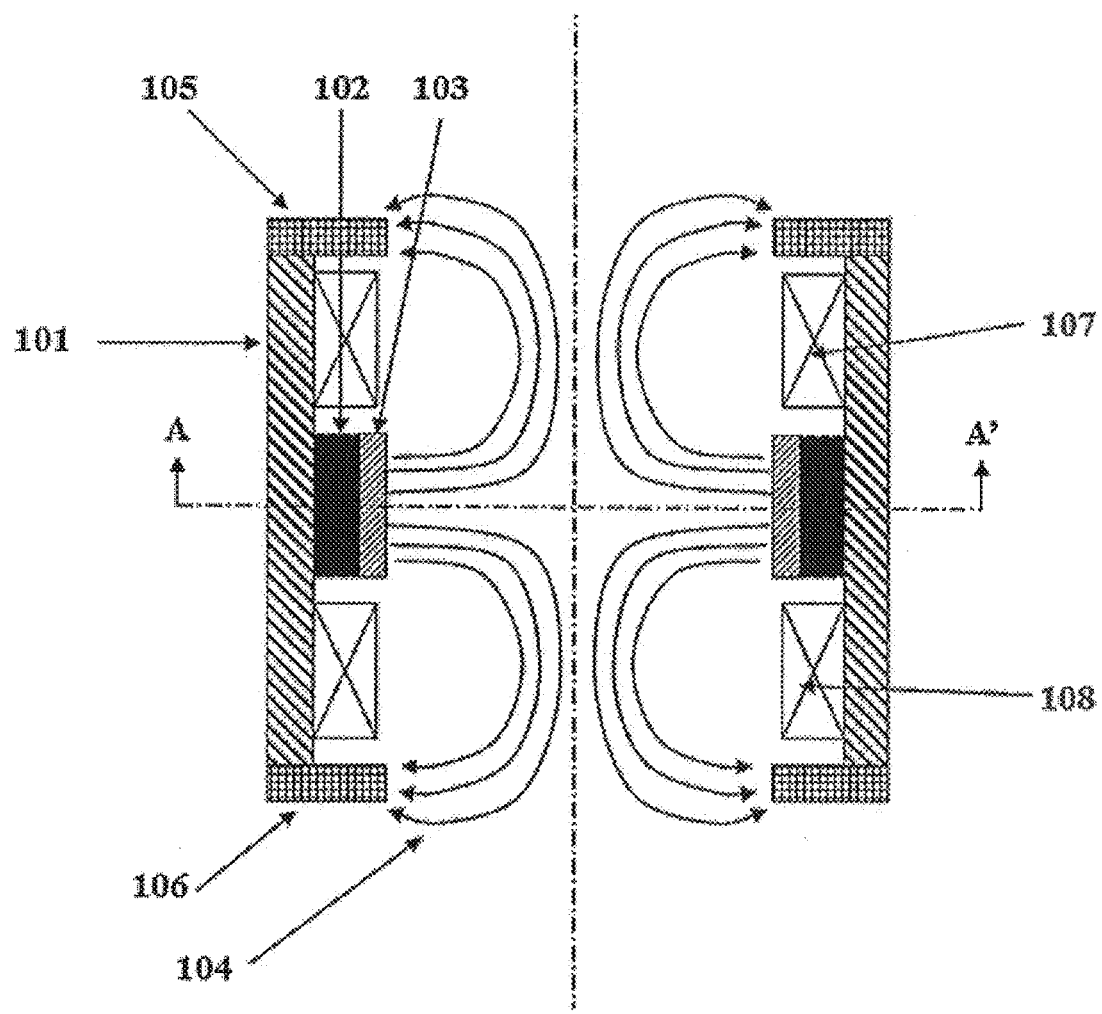
FIG. 1 illustrates a first embodiment of an electron lens of the present invention.

FIG. 1 illustrates the first embodiment of an electron lens of the present invention. At least one stage of electron lens is used in an electron beam device having a plurality of electron guns emitting electron beams in the Z direction. At least one stage of electron lens using a magnetic field to focus an electron beam to form an image is a radially thin-walled cylindrical, magnetic field-type electron lens having a ferromagnet composed of a radially thin-walled cylindrical ferromagnet 101 located as an outer circumference with the Z axis as the central axis, a radially thin-walled cylindrical permanent magnet 102 which is located inside the radially thin-walled cylindrical ferromagnet located as the outer circumference, is polarized along the radial direction, and has a length smaller than or equal to approximately half the length of the radially thin-walled cylindrical ferromagnet, and a radially thin-walled cylindrical ferromagnet 103 which is located, as an inner circumference, inside the radially thin-walled cylindrical permanent magnet and has a length greater than or equal to that of the thin-walled cylindrical permanent magnet 102 in the Z direction. This radially thin-walled cylindrical electron lens has a cylindrical nonmagnetic space therein, and the cylindrical nonmagnetic space has a radius greater than approximately one-third the radius of the outer circumference of the radially thin-walled cylindrical ferromagnet 101 located as the outer circumference.

The X axis and Y axis directions are directions orthogonal to the Z axis direction, and in the case of the multicolumn system, the electron lenses are located on the plane defined by the X axis and the Y axis. The electron lenses do not have to be located on an exact X-Y plane and may be located on a substantial X-Y plane. Further, although the X axis and the Y axis can be set as desired so long as the X axis and the Y axis are orthogonal to each other, the X axis and the Y axis are determined such that the electron lenses are arranged along the X and the Y directions.

The ferromagnet composed of the radially thin-walled cylindrical ferromagnet 101 located as the outer circumference with the Z axis as the central axis is used to reduce a fringing field outside the electron lens. Magnetic flux emitted from the radially thin-walled cylindrical permanent magnet 102 polarized along the radial direction in a direction toward the center of the cylindrical axis may not be able to form an axially symmetric magnetic field if the polarization of the permanent magnet 102 is not uniform. Therefore, by providing, inside the radially thin-walled cylindrical permanent magnet 101, the radially thin-walled cylindrical ferromagnet 103 as the inner circumference, which has a length greater than or equal to that of the thin-walled cylindrical permanent magnet 102 in the Z direction, it is possible to form magnetic flux 104 having an axially symmetric intensity distribution inside the electron lens.

An upper correction magnet coil 107 and a lower correction coil 108 are located on the upper and the lower sides of the cylindrical permanent magnet 102, respectively. In these upper correction coil 107 and lower correction coil 108, currents flow in opposite directions, to thereby correct the magnetic field generated by the permanent magnet 102.

Second Embodiment

Figure 2:
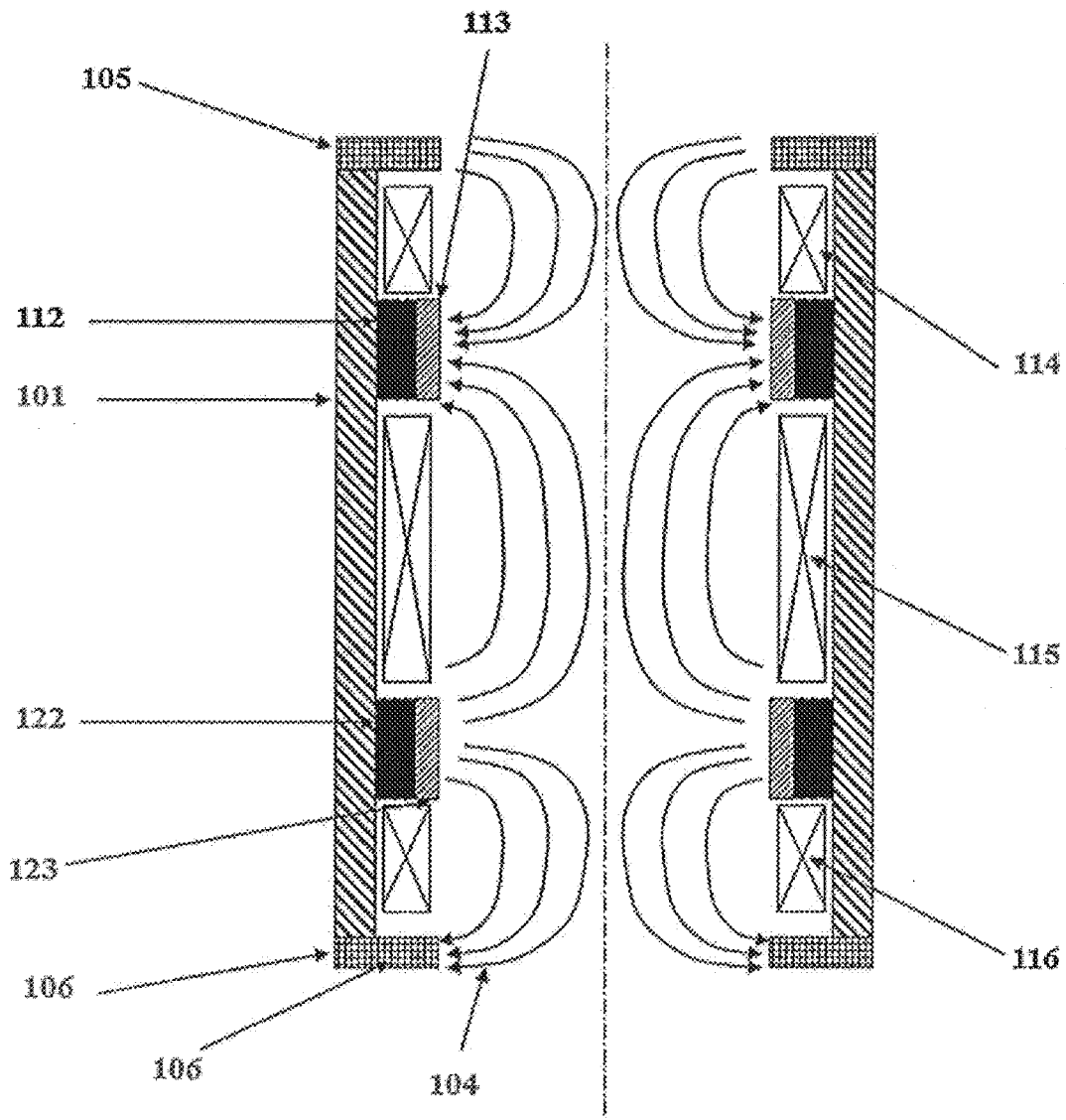
FIG. 2 illustrates a second embodiment of the electron lens of the present invention.

FIG. 2 illustrates a second embodiment of the electron lens of the present invention. This electron lens is a radially thin-walled cylindrical, magnetic field-type electron lens. The electron lens has, inside the radially thin-walled cylindrical ferromagnet 101 located as the outer circumference, a pair of the radially thin-walled cylindrical permanent magnets 112 and 122 installed so as to sandwich the position occupied by the radially thin-walled cylindrical permanent magnet 102 of the first embodiment polarized along the radial direction and a set of magnet coils (correction magnet coils) 114, 115, and 116 each having a general inner diameter equal to the inner diameter of the radially thin-walled cylindrical permanent magnets 112 and 122, and the set of the radially thin-walled cylindrical permanent magnets 112, 122 and the magnet coils 114, 115, 116 generate opposite magnetic fields. The electron beam drawing device or the electron beam inspection device for inspecting a substrate using an electron beam has the electron gun and the electron beam optical lens barrel in which a plurality of radially thin-walled cylindrical, magnetic field-type electron lenses are arranged in parallel to the Z axis.

Here, the permanent magnets 112 and 122 generate magnetic fields in opposite directions, as shown in the figure. Three correction magnet coils arranged in the upper, the middle, and the lower portions with respect to the permanent magnets 112 and 122; that is, the correction magnet coil 114 in the upper portion, the correction magnet coil 115 in the middle portion, and the correction magnet coil 116 in the lower portion correct the magnetic fields generated by the permanent magnets 112 and 122. The correction magnet coil 114 in the upper portion and the correction magnet coil 116 in the lower portion have almost the same strength and generate magnetic fields in the same direction, while the correction magnet coil 115 in the middle portion has twice the strength of the correction magnet coil 114 in the upper portion and the correction magnet coil 116 in the lower portion and generates a magnetic field in the direction opposite that generated by these coils.

Figure 3:
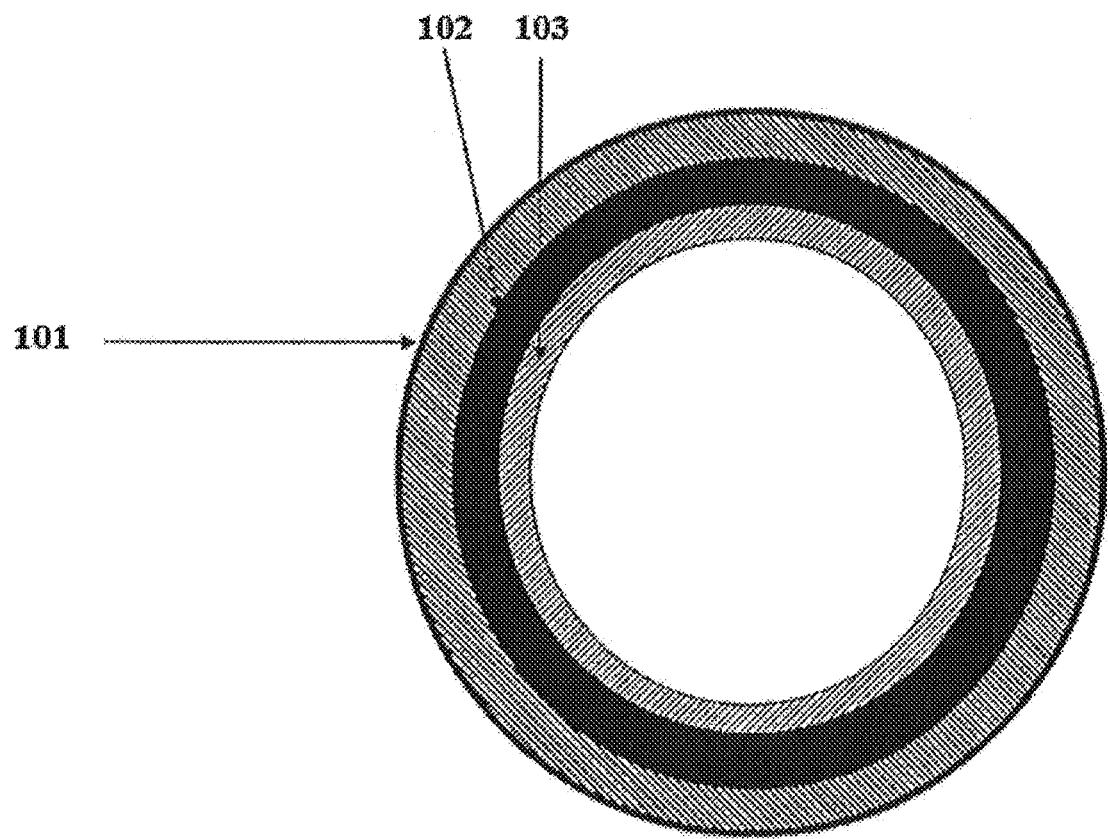
FIG. 3 shows a cross section of a surface perpendicular to the central axis of a cylinder of the electron lens (surface along A-A' in FIG. 1) of the present invention.

FIG. 3 shows a cross section of the first embodiment of the electron lens of the present invention taken along a line A-A' of FIG. 1. The electron lens has the ferromagnet composed of the radially thin-walled cylindrical ferromagnet 101 located as the outer circumference and, inside the radially thin-walled cylindrical ferromagnet located as the outer circumference, the radially thin-walled cylindrical permanent magnet 102 having a length smaller than or equal to approximately a half that of the radially thin-walled cylindrical ferromagnet 101 and polarized along the radial direction. Further, this electron lens is the radially thin-walled cylindrical, magnetic field-type electron lens having, inside the radially thin-walled cylindrical permanent magnet, the radially thin-walled cylindrical ferromagnet 103 which is located as the inner circumference and has a length greater than or equal to that of the thin-walled cylindrical permanent magnet 102 in the Z direction.

Figure 4:
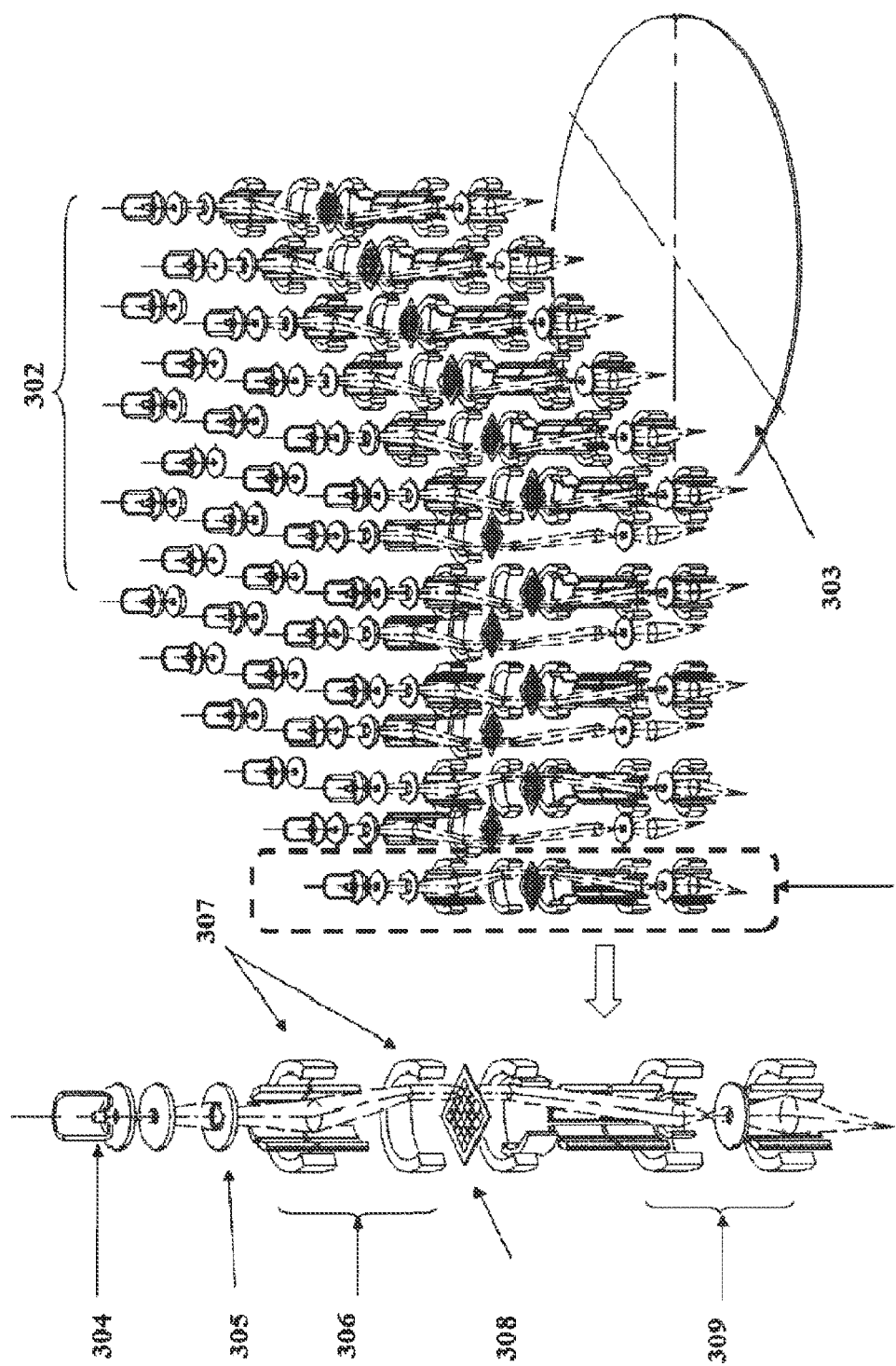
FIG. 4 shows a multicolumn electron beam drawing device employing the electron lens of the present invention.

FIG. 4 shows a multicolumn electron beam drawing device employing an electron gun of the present invention. The multicolumn electron beam drawing device has a array 302 in which 10 to more than 250 columns referred to as individual column elements 301 each having a thickness of, for example, approximately 15 mm to 40 mm are arranged two dimensionally. Therefore, it is possible to expose a Si (silicone) wafer 303 (of, for example, 300 mm φ) at high speed. This multi-column configuration is applicable to the electron beam inspection device for inspecting semiconductor substrates.

The individual column element 301 is composed of the parts described below. An electron beam emitted from an electron gun cathode part 304 is shaped into a rectangular shape at a first rectangular aperture 305 and forms an image on a second rectangular aperture or a CP (character projection) mask 308 using a lens optical system 306 in the first half. A position of the beam on the rectangular aperture or the CP mask is provided by reshaping the beam into a beam having a desired size or shape using a beam deflector. In a case of a variable rectangular beam, a rectangular beam having a desired size is formed by two rectangular apertures. In a case of CP (character projection), by emitting a beam onto a character installed in a predetermined position in the second stage, the electron beam which has passed through the character is shaped into a desired and intended beam shape according to an aperture formed in the character. Further, a lens optical system 309 provided at the subsequent stage deflects the beam to an appropriate position on the wafer 303 to thereby form an image. When further disassembled, the electron lens systems 306 and 309 are composed of electron lenses 307.

Figure 6:
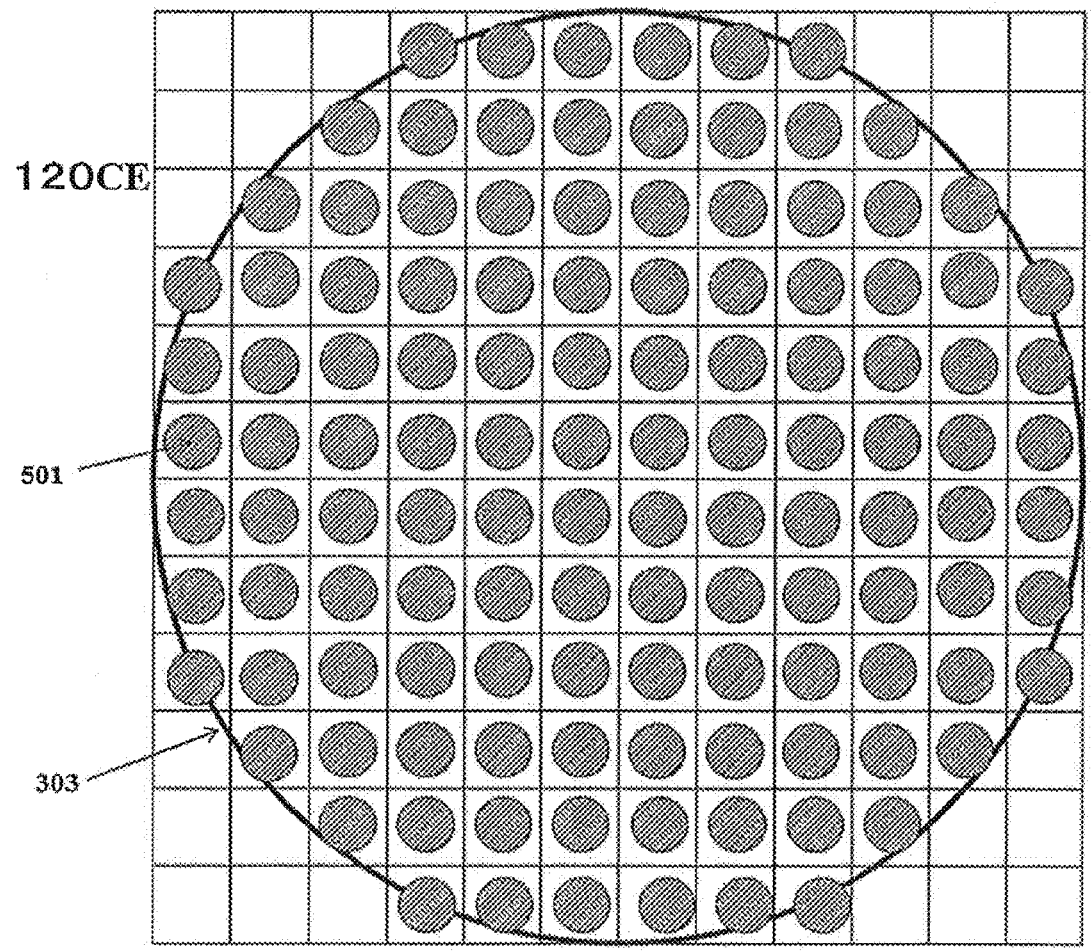
FIG. 6 illustrates multiple columns and wafers.

FIG. 6 illustrates multiple columns and wafers. An area of 25×25 mm per column is subjected to electron beam drawing or electron beam inspection. On the 300 mm Si wafer, column elements 501 are aligned at regular intervals at a 25 mm pitch in the horizontal direction (X direction) of the two dimensions and are also aligned at regular intervals at a 25 mm pitch in the vertical direction (Y direction). A line 303 indicates an outer circumferential circle of the Si wafer. If approximately half or more of a 25 mm rectangular area drawn by a column element is expected to be located within the outer circumference of the wafer, the column element 501 is installed. In other than these small rectangular areas, column elements are not installed. In FIG. 6, by providing 120 column elements, the entire wafer can be drawn.

Figure 7:
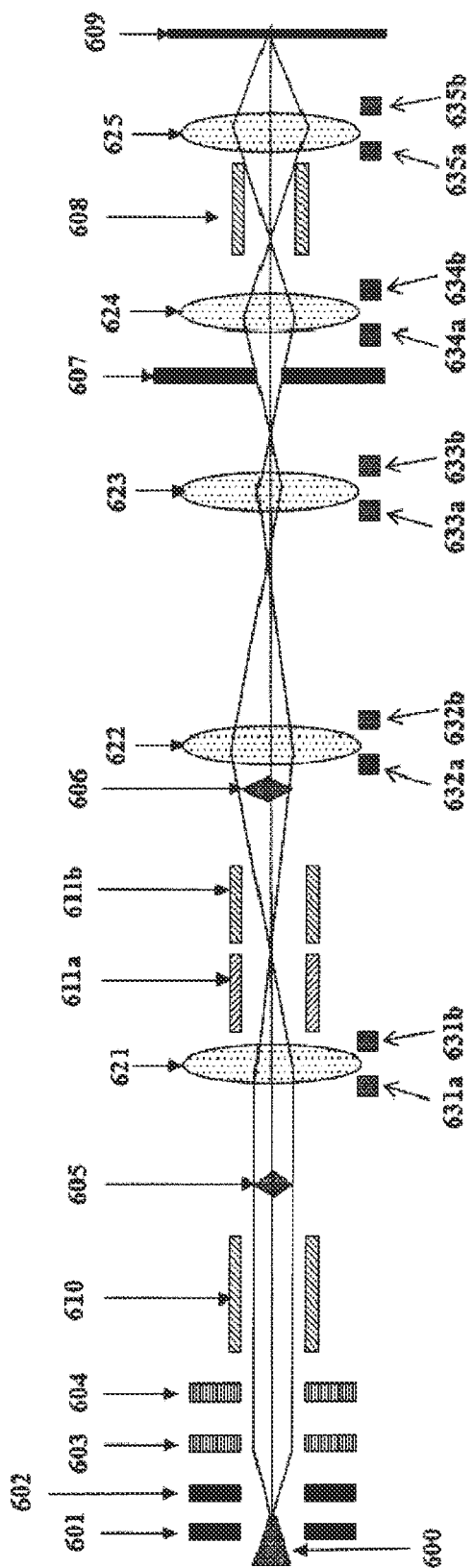
FIG. 7 shows a vertical cross section of the electron beam drawing device.

FIG. 7 shows a vertical cross section of the electron beam drawing device. A suppressor electrode 601 and an extraction electrode 602 control an amount of current emission and an emission shape of an electron beam emitted from an electron gun cathode part 600. The electron beam subjected to appropriate electrostatic lens action at an electron gun lens electrode 603 is accelerated to 50 kV at an anode (earth potential) 604. Further, the beam passes through a blanking deflection electrode 610 and is shaped into a rectangular shape at a first rectangular aperture 605, thereby forming an image on a second rectangular aperture or a CP (character projection) mask 606 through a lens optical system 621 in the first half. A position on the rectangular aperture or the CP mask is provided by reshaping the beam into a beam having a desired size or shape and deflecting the beam by beam deflectors 611a and 611b such that a crossover image in which beams intersect is not moved, in order to prevent a change in the electron beam density of a finally-formed image. In the case of a variable rectangular beam, a rectangular beam having a desired size is formed by two rectangular apertures. In the case of CP (character projection), by emitting a beam onto a character provided at a predetermined position in the second stage, the electron beam which has passed through the character is shaped into a desired and intended beam shape according to an aperture formed in the character. Further, lens optical systems 624 and 625 and a positioning deflector 608 provided in the subsequent stage deflect the beam to an appropriate position on a wafer 609 to thereby form an image.

Although, in FIG. 7, components 621, 622, 623, 624, and 625 are magnetic-field-type lenses each composed of a permanent magnet mainly made of samarium cobalt or a samarium cobalt magnet, in order to construct a desired lens optical system, the magnification is adjusted by placing a focus on a precise position using correction coils 631a, 631b, 632a, 632b, 633a, 633b, 634a, 634b, 635a, and 635b each employing an electromagnet, because there is a margin of error of about ±5% in the focal position and the magnification.

When the permanent magnet is used in the electron lens, it is preferable to use a samarium cobalt permanent magnet or a neodymium magnet having a small size and sufficient strength. In particular, because a neodymium magnet is the strongest magnet at present and it is the only magnet that can be polarized along the radial direction when made into a cylindrical ring, it is generally desirable to utilize the neodymium magnet.

However, such a small and strong permanent magnet has an undesirable characteristic that a magnetic field strength changes depending on a temperature. In particular, in the neodymium magnet, there occurs a phenomenon that the neodymium magnet cannot be used at a stable strength unless temperature stabilization is not performed to create change (reduction) of the magnetic field strength by approximately 1100 ppm by changing (increasing) a temperature by one degree Celsius near the normal temperature of 0 degree Celsius. Similarly, in samarium cobalt, by changing (increasing) a temperature by one degree Celsius near the normal temperature of 0 degree Celsius, a magnetic field strength is changed (reduced) by approximately 300 ppm. Such instability of the temperature is caused by changes in the room temperature and heat generated by the correction coils when the permanent magnet does not have an appropriate value for generating a magnetic field. The change of the magnetic field strength by 1100 ppm in the neodymium magnet causes, in an electromagnetic lens having a focal depth of 30 mm, a focus change of 33 μm and a defocus of 165 nm with a convergence half angle of 5 mrad. There is also a positional change of 50 nm in the size of the deflection field when a deflection of 50 μm is made on one side. Therefore, those magnets cannot be used without the temperature control.

In order to stabilize the above-described instability to thereby enable the magnet to be used, it is necessary to control a temperature of the neodymium magnet at an accuracy smaller than or equal to 0.001 degree Celsius, at a system operation temperature of approximately 23 degrees Celsius to 24 degrees Celsius. If a temperature is controlled at this level of accuracy, the instability of the focus depth is smaller than or equal to 33 nm, while the defocus is within 0.165 nm and the lateral position shift is within 0.05 nm, and therefore, the magnet is sufficiently capable of being used. In addition, because, in samarium cobalt, under this temperature stabilization condition, the strength variation coefficient due to a temperature change becomes less than or equal to one-third and becomes 0.003 ppm per time, the problem is further alleviated.

Actual cooling of the neodymium magnet is performed by bathing, in water or an insulating liquid such as Fluorinert, one stage of lens among multicolumn lenses containing a plurality of neodymium magnets. It is possible to control the temperature within a certain temperature range by circulating a liquid coolant, measuring a temperature, and repeating heating and cooling in an alternating manner.

In an optical lens barrel composed of multiple columns, temperature control is required for not only the neodymium magnet but also the entire retainer plate of the first rectangular aperture and the entire retainer plate of the second rectangular aperture, etc. It is important to control a temperature of the entire configuration at each stage along the vertical direction of the multiple columns, in order to ensure the overall positional stability of the beams.

Figure 8:
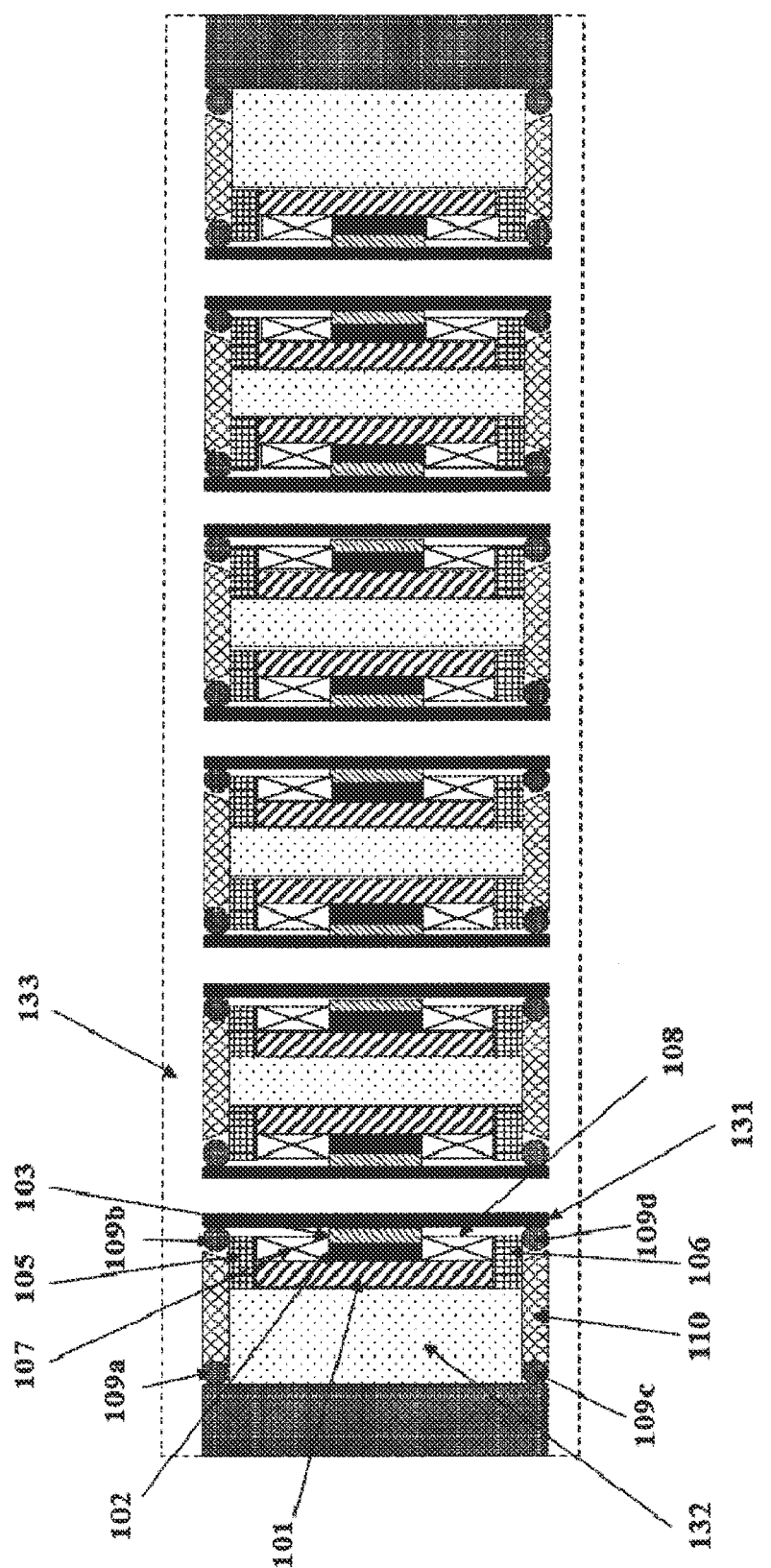
FIG. 8 shows a cross section when the electron lenses are used in multiple columns.

FIG. 8 shows a lateral cross section of the electron lenses in the multiple columns. Each lens is isolated from a vacuum portion 133 through which the electron beam passes by O-rings 109a, 109b, 109c, and 109d and a vacuum sealing cylinder 131. Further, for the purpose of reducing temperature changes generated by Joule heat and reducing strength changes of the permanent magnet caused by the temperature change, around the electron lens, a liquid 132 (for example, Flourinert) fills the space including the permanent magnet and circulates therethrough. In addition, by adopting a highly accurate temperature control scheme, a temperature of the liquid is stably maintained within a range of less than or equal to 0.001 degrees Celsius.

Third Embodiment

Figure 9:
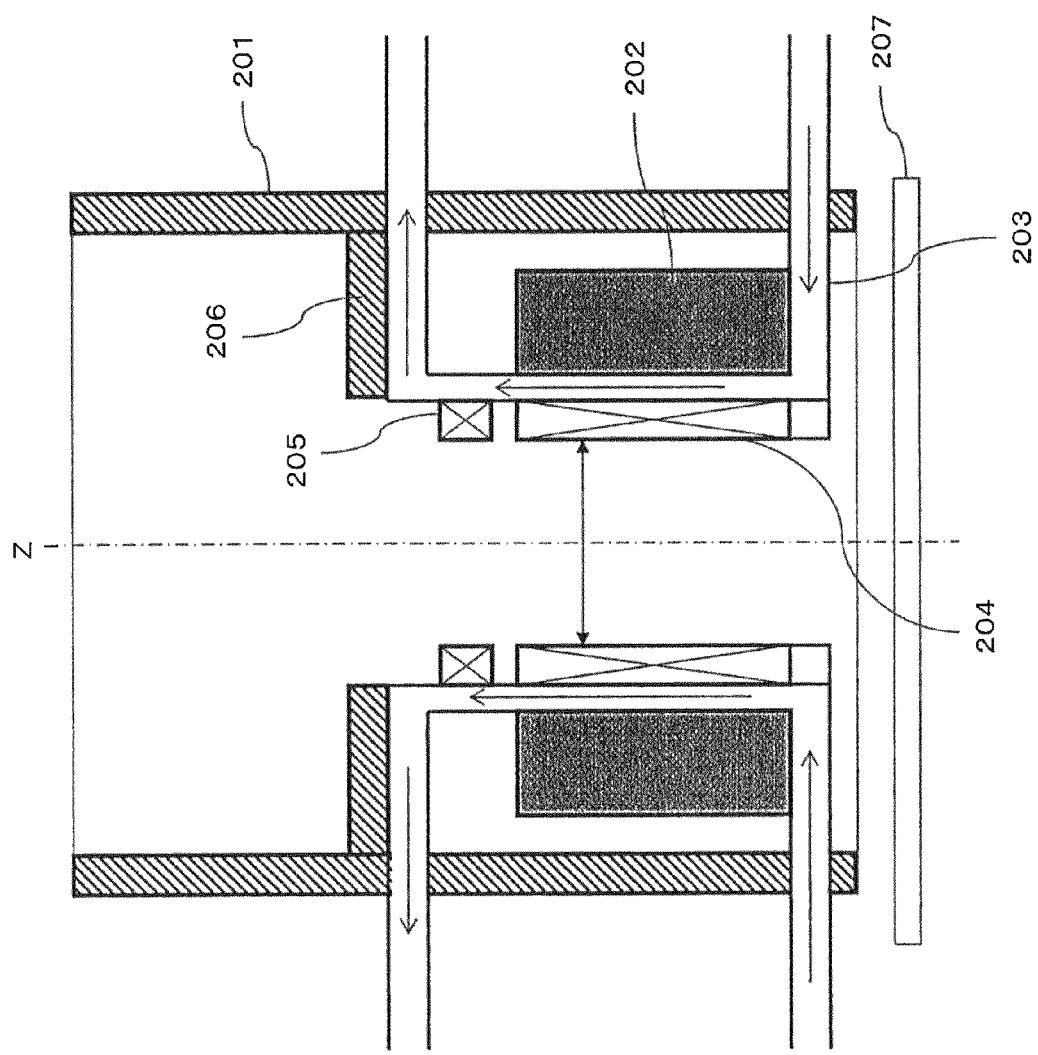
FIG. 9 illustrates a third embodiment of the electron lens of the present invention.

FIG. 9 shows a configuration of the third embodiment. This electron lens has an outer cylinder 201 composed of a thin-walled cylindrical ferromagnet. This outer cylinder is made of, for example, pure iron and reduces a fringing field outside the electron lens. With this ferromagnet outer cylinder 201, it is possible to avoid magnetic field interference caused between adjacent columns when the electron guns are provided in a multicolumn arrangement.

A permanent magnet (cylindrical permanent magnet) 202 having a diameter smaller than that of the outer cylinder 201 is positioned inside the outer cylinder 201. Unlike the above-describe embodiments, this permanent magnet 202 is polarized along the axial direction (direction in parallel to the Z axis). Therefore, magnetic flux generated by the permanent magnet 202 is emitted from the upper and lower end portions of the permanent magnet 202 (both end portions along the Z axis direction) in the direction parallel to the Z axis, then curves to the center direction, and passes along the central axis (Z axis). The permanent magnet 202 is formed of, for example, samarium cobalt. With this permanent magnet 202, the electron beam can be focused.

Further, there is provided a flanged inner cylindrical member 203 which partitions a space inside the outer cylinder 201, contains the permanent magnet 202 in that space, and has flange portions projecting outside from the upper and the lower ends thereof. That is, a doughnut-shaped space is partitioned between by the outer circumferential surface of the flanged inner cylindrical member 203 and the bottom surface and the top surface of the upper and the lower flange portions, and the cylindrical permanent magnet 202 is located within this space. In this example, an inner circumferential surface of the permanent magnet 202 is in contact with the outer circumferential surface of the flanged inner cylindrical member 203 and the top surface of the lower side flange portion.

This flanged inner cylindrical member 203 has a hollow center, and this hollow serves as a coolant passage. In particular, the portion extending in the Z direction has a dual structure as a whole and is in contact with the permanent magnet 202 from inside to cool the permanent magnet 202. Here, the coolant is a liquid made of a nonmagnetic material, and various types of commercially available coolants (such as Flourinert) can be employed. Water can also be used. Further, the flanged inner cylindrical member 203 is preferably made of a nonmagnetic material such as aluminum.

In the flanged inner cylindrical member 203, the coolant is supplied from the periphery of the lower flange portion and flows laterally through the lower flange portion toward the center portion and then upwardly through the cylindrical portion. The coolant then flows through the upper flange portion toward the periphery and flows to the outside. The coolant is supplied from a coolant tank to the flanged inner cylindrical member 203 by means of a pump. After the coolant ejected from flanged inner cylindrical member 203 is cooled by a heat exchanger, etc., it returns to the coolant tank. As described later, the coolant may flow in the opposite direction.

Further, a cylindrical correction coil 204 is positioned on the inner side of the flanged inner cylindrical member 203. This coil corrects a magnetic field generated by the permanent magnet 202. By means of a current flowing in this coil, it is possible to adjust the magnetic field strength to a predetermined strength. In other words, the cylindrical correction coil 204 is used to compensate for overage and shortage of the magnetic field strength generated by the permanent magnet 202. In this example, a part of the flanged inner cylindrical member 203 is projected toward the inside to support the correction coil 204 from the lower side.

Here, as shown in the figure, because the flange portions of the flanged inner cylindrical member 203 pass through the outer cylinder 201, the outer cylinder 201 is separated into different parts between the upper and the lower sides of the flange portions. However, it is also possible to provide a plurality of separate flange portions and provide the outer cylinder 20 in gaps between these portions. Specifically, although the flange portion has the coolant passage therein, because it has a sufficient flow passage area and is connected to a conduit in the periphery, it doses not have to have a large cross section serving as a conduit area, and there is no problem even if it is separated into a plurality of portions. Further, because the purpose of employing the flanged inner cylindrical member 203 is to control temperature changes of the permanent magnet 202 by absorbing heat from the correction coil 204, the passage in the radial direction does not have to have a large cross section, and a conduit may also be adopted. The passage may adopt a variety of shapes including, for example, a spiral shape and an S shape, and may also be divided into a plurality of passages.

A stig coil 205 for shaping an electron beam is provided above the correction coil 204. The flanged inner cylindrical member 203 also absorbs heat generated by the stig coil 205.

Figure 13:
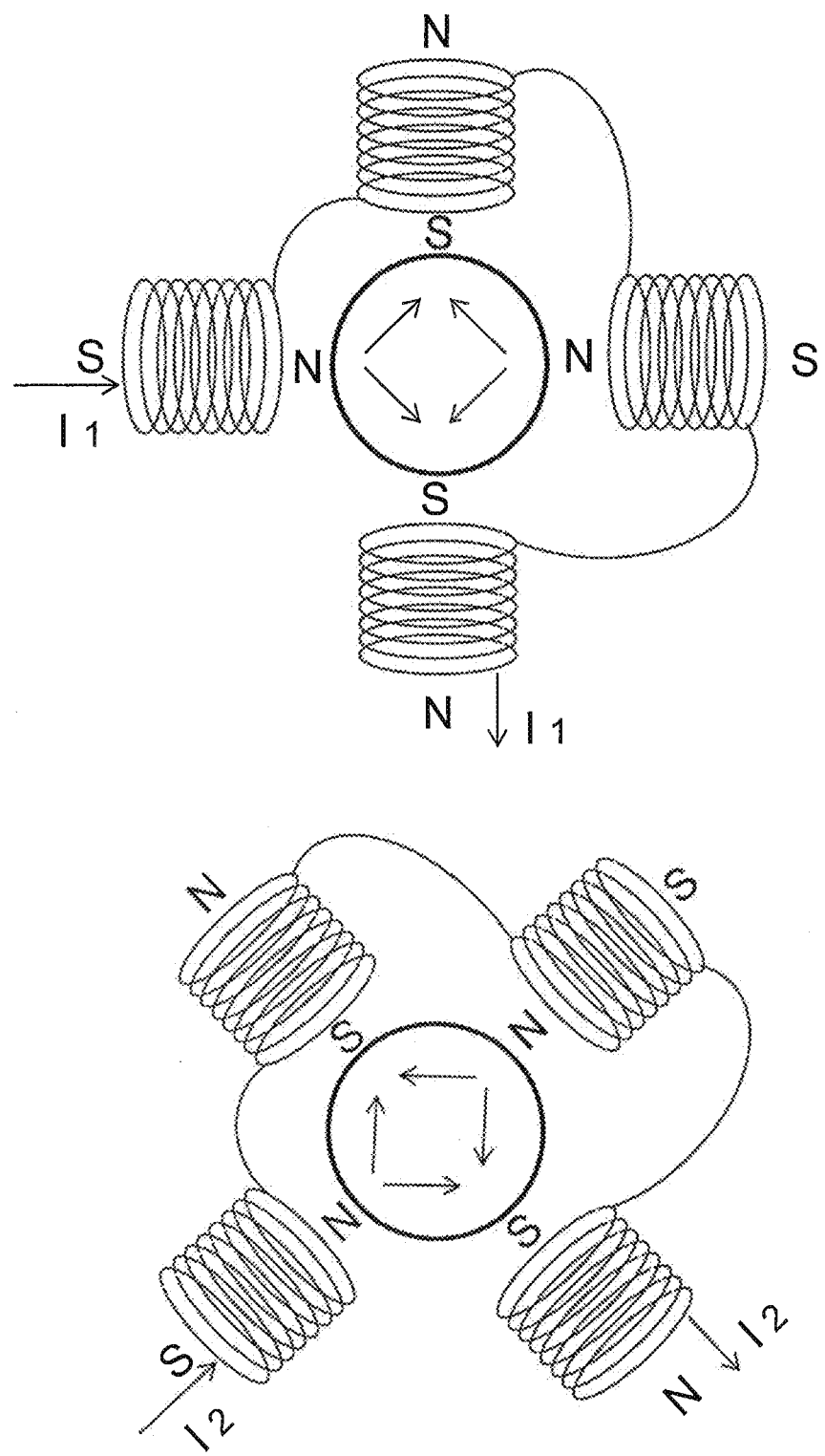
FIG. 13 illustrates an embodiment of a stig coil employed in the present invention.
Figure 14:
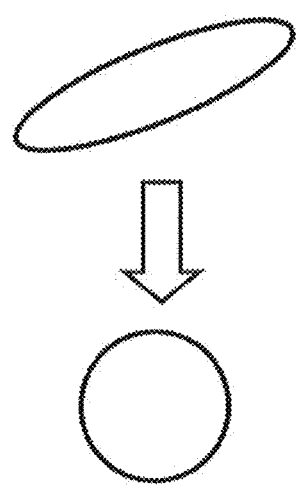
FIG. 14 illustrates correcting a cross section of a beam produced by the stig coil employed in the present invention.

Here, as shown in FIG. 13, the stig coil 205 is composed of two sets of coils each including four coils arranged in a cross shape, and the two sets of coils are arranged so that the arrangement directions of the four coils are shifted from those of the other set by 45 degrees along the traveling directions of two beams. In the figure located on the upper side of FIG. 13, the two coils facing in the vertical direction both have the S pole on the center side, while the two coils facing in the lateral direction have the N pole on the center side. Then, the figure located on the lower side of FIG. 13 shows a configuration rotated by 45 degrees from the figure on the upper side. Therefore, with the two coils, it is possible to shape a beam passing through the center along a direction perpendicular to the paper and shape an elliptical beam at a random angle to a circular shape, as shown in FIG. 14.

Further, in this example, a circular plate 206 which has a doughnut shape and is formed of the same magnetic material as the outer cylinder 201 is provided on the upper flange portion of the flanged inner cylindrical member 203, and it partitions the space occupied by the magnetic field of the permanent magnet 202 and the upward space.

A sample 207 to which the electron beam is emitted is positioned under the above-described configuration, and the electron beam controlled by the electron lens is then emitted to the sample.

Figure 10:
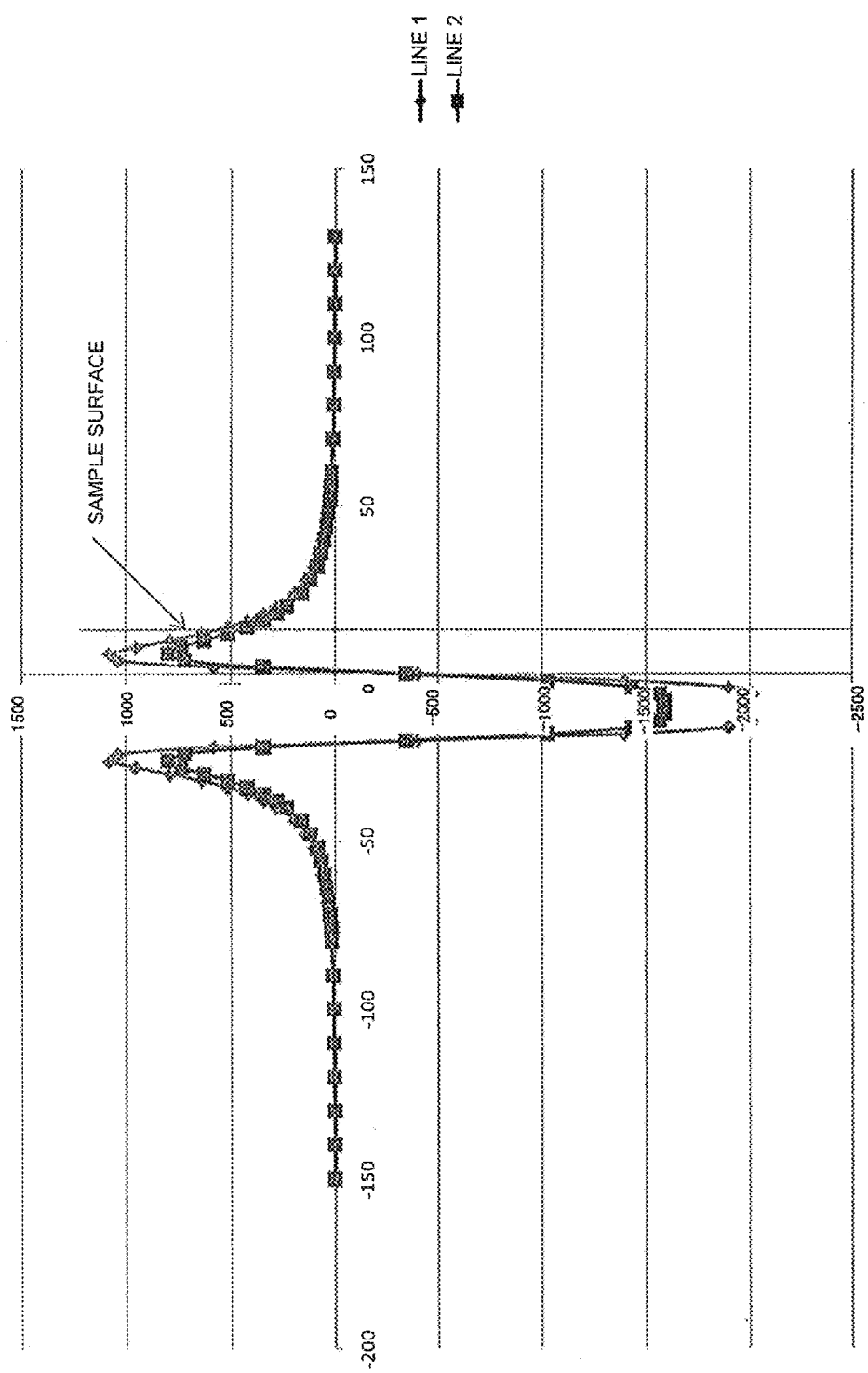
FIG. 10 shows a status of a magnetic field in the electron lens.

FIG. 10 shows the magnetic field strength of the electron lens having such a configuration. In this figure, the Z axis is indicated as the lateral axis, and the upper configuration is located on the left side, while the sample is located on the right side. The magnetic field strength has a large negative value inside the permanent magnet 202 in the Z axis direction and has certain positive peaks near the upper and the lower sides of the permanent magnet 202.

In this example, the permanent magnet 202 is located at a position between −20 mm to 0 mm, and the sample 207 is located at a position of 10 mm. In the figure, the line connecting between the diamond shaped points (line 1) indicates a magnet thickness of 12 mm, while the line connecting between the square points (line 2) indicates a magnet thickness of 10 mm.

With the electron lens having such a configuration, it is possible to focus the electron beam narrowly and reduce occurrence of aberration of the electron lens depending on a temperature.

In other words, it is necessary to make the electron lens as small and thin as possible for the multicolumn electron beam irradiation device. However, in order to reduce defocus caused by the Coulomb effect, a convergence half angle of approximately 10 mrad is required. Even if a convergence half angle of approximately 10 mrad is achieved, a spherical aberration coefficient of approximately 5 mm is required, in order to narrow the beam to approximately 5 nm. Therefore, it is necessary to reduce the spherical aberration coefficient to a great extent.

To achieve this, it is necessary to employ a permanent magnet lens which can form a magnetic field using a large and thick lens, in a space of 20 mm to 30 mm immediately above the sample (wafer) to which the electron beam is applied.

Because in the permanent magnet ring polarized along the radial direction according to the above-described embodiment, two magnetic fields in the positive direction and the negative direction are used, and because these magnetic lenses act as two thin-walled lenses having an interval therein, it has been impossible to make the spherical aberration coefficient less than or equal to 10 mm to 20 mm.

Therefore, the present embodiment employs the permanent magnet 202 which is polarized along the cylindrical axis direction.

By employing this magnet, the first peak is directed to the positive direction as shown in FIG. 10. Here, in the electron lens, the beam-focusing strength acts proportionally to the amount obtained by integrating a square of a magnetic field B along the Z axis direction, and the magnetic field of the lens is long along the Z direction and strong near the sample. Therefore, the lens generating a magnetic field has a small spherical aberration.

As such, the sample surface is preferably located in the middle of the second positive peak of the magnetic field in FIG. 10. In this way, the relatively long negative magnetic field can be used as an effective lens magnetic field, and as the sample surface is near this magnetic field, the working distance becomes short.

Here, cooling is performed by circulating the coolant in the above-described flanged inner cylindrical member 203, in order to ensure the thermal stability of the permanent magnet 202. If the permanent magnet 202 is made of samarium cobalt, the magnetic field strength changes at a temperature coefficient of 300 ppm/degree Celsius (a change of magnetic field strength per one degree is 300/million).

Therefore, if the temperature of the permanent magnet 202 is controlled so that a temperature change of 3 m degree K is obtained, it is possible to maintain a stability of 1 ppm/degree Celsius. It is preferable to employ as the coolant, for example, Flourinert which is a fluorine inactive liquid and has high thermal conductivity.

Further, for example, when the permanent magnet 202, etc. vibrates due to circulation of the coolant, focus of the electron beam is adversely affected. Therefore, it is necessary to make an arrangement to circulate the coolant smoothly so as not to transmit minute vibrations. The coolant thermally separates the components generating Joule heat, such as the correction coil 204 and the stig coil 205, from the permanent magnet 202. In doing so, the temperature stability of the permanent magnet 202 is also ensured.

Figure 11:
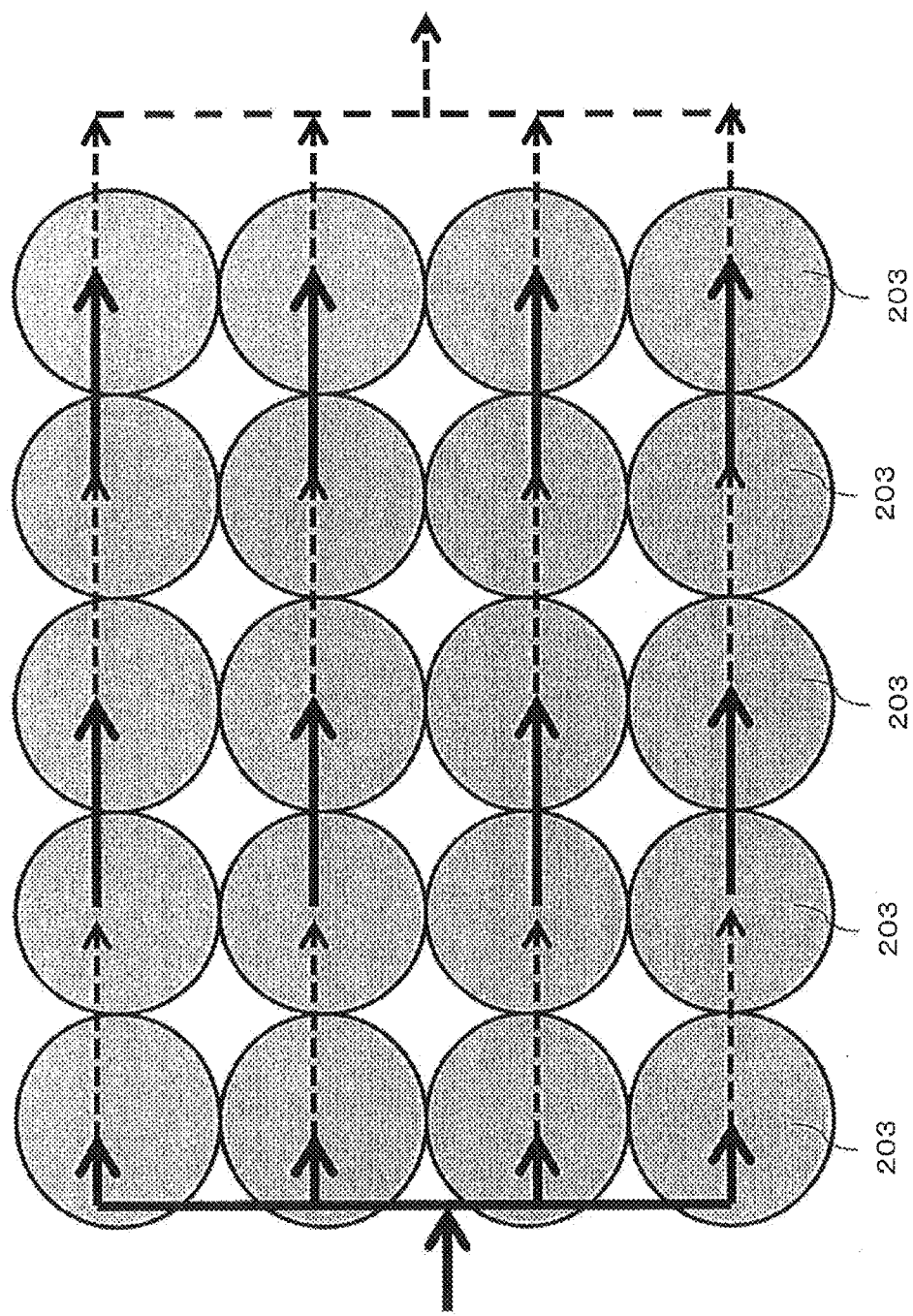
FIG. 11 shows a configuration of a coolant passage.

FIG. 11 shows a schematic view of a conduit for the coolant. In consideration of a case where groups of lenses are arranged in lines, and in each of the lines, a fluid entered from the upper flange portion of the electron lens passes through the cylindrical member and exits from the lower flange portion, and a fluid entered from the lower flange portion passes through the cylindrical member and exits from the lower flange portion, solid lines indicate that the fluid reaches the flanged inner cylindrical member 203 of the adjacent column on the upper side, while the dotted lines indicate that the fluid reaches the flanged inner cylindrical member 203 of the adjacent column on the lower side.

After passing through the upper flange portion, the coolant enters the upper flange portion of the next lens and then passes through a cylindrical member between the coil and the permanent magnet in the center portion toward the lower flange portion. The fluid flows in one direction while repeating passage through such flow passages in an alternating manner. In this example, after entering from the flow passage on the left end, the fluid is separated into four lines. The fluid then passes through the respective flow passages and exits from the flow passage on the right end.

Here, it is necessary to estimate the amount of Joule heat generated by the correction coil 204. Generally, a magnet coil generates a heat of 300 to 500 W per lens as Joule heat. The correction coil 204 has a margin of error of ±5% with respect to the polarized magnetic field of the permanent magnet 202. Therefore, the amount of heat generation is 0.25%, which is below 1.25 W. Even if there are one hundred lenses, the amount remains 125 W; that is, 30 Cal. Therefore, although a temperature difference of 0.3 degrees occurs between an inlet and an outlet at a flow rate of 100 cc per second, it is possible to sufficiently control and stabilize the temperature to be constantly less than or equal to 0.003 by performing temperature control by attaching thermometers to various parts of the lens and returning the fluid to a chiller as a storage tank of the coolant. That is, there is no need to use a special heat exchanger, etc.

Fourth Embodiment

Figure 12:
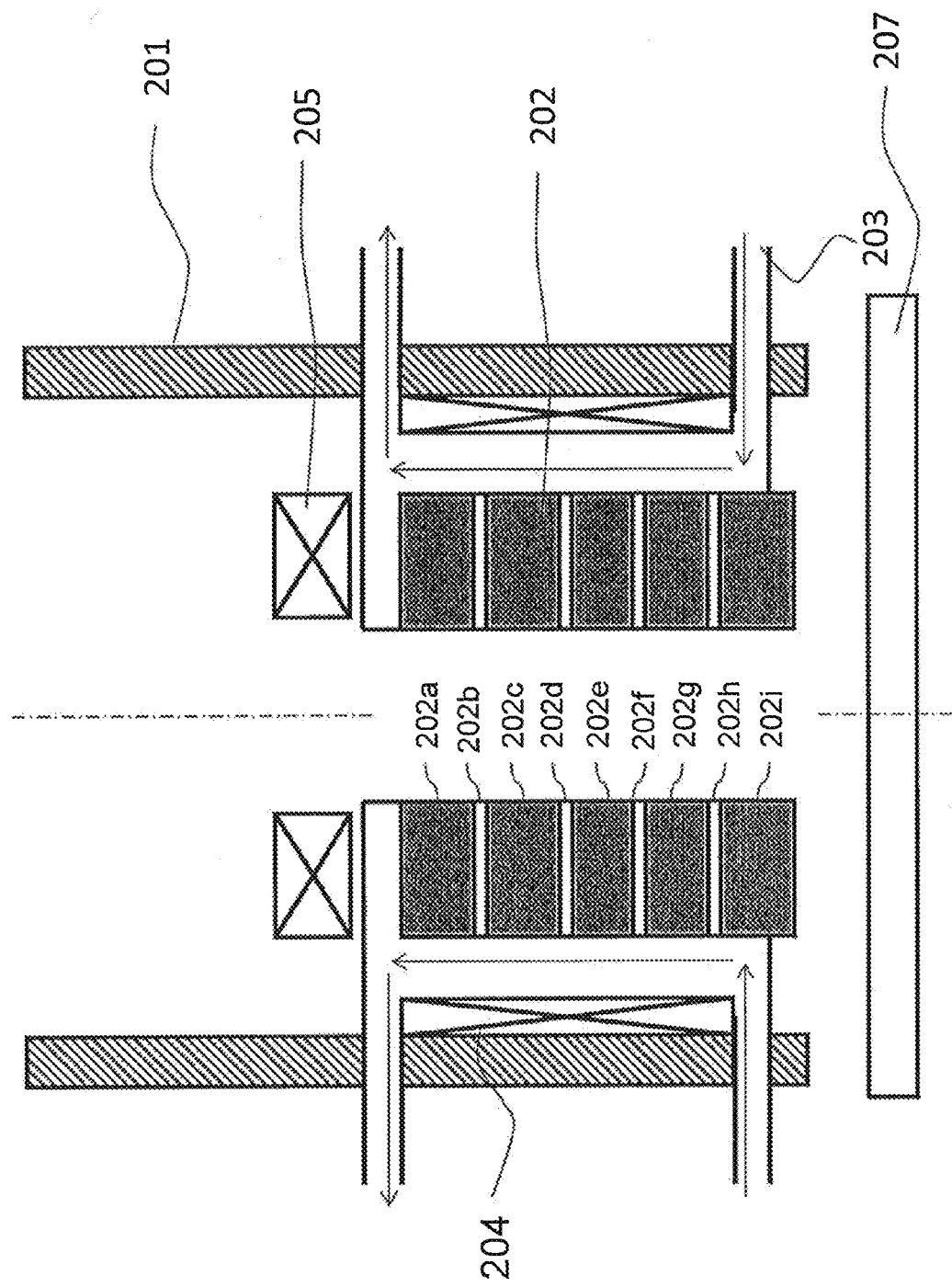
FIG. 12 illustrates a fourth embodiment of the electron lens of the present invention.

FIG. 12 shows a fourth embodiment in which the inside and outside relationship between the permanent magnet 202 and the correction coil 204 are changed from the third embodiment.

Further, in this embodiment, the doughnut-shaped circular plate 206 made of a ferromagnetic material is omitted. This is because the circular plate 206 is used to match the magnetic potential within the same plane, and therefore, it is not essential in the electromagnetic lens.

The permanent magnet 202 may be located inside or may be located outside, so long as the permanent magnet 202 and the correction coil 204 are thermally separated by the flowing coolant. In the present embodiment, the permanent magnet 202 is located inside, while the correction coil 204 is located outside, and the flanged inner cylindrical member 203 for circulating the coolant is provided between them.

Although the permanent magnet 202 may be an integral cylindrical permanent magnet as in the third embodiment, in the present embodiment, the permanent magnet 202 has a configuration divided into a plurality of pieces along the axis direction, in consideration of non-uniform magnetic field strength along the axis and degradation of the axial asymmetry. That is, the permanent magnet 202 is formed by stacking, along the axial direction, divided ring magnets 202a, 202c, 202e, 202g, and 202i which are integrally made of samarium cobalt and have a short length in the axial direction. Therefore, each of the divided ring magnets 202a, 202c, 202e, 202g, and 202i has a thickness of approximately one-fifth the overall thickness.

Then, ring plates 202b, 202d, 202f, and 202h having a thin-walled circular ring plate shape are positioned along the axial direction in the gaps among the divided ring magnets 202a, 202c, 202e, 202g, and 202i. These ring plates 202b, 202d, 202f, and 202h are made of a nonmagnetic material such as aluminum, or of different types of permanent magnets, such as pure iron serving as a ferromagnet and permanent magnet neodymium.

When the permanent magnet 202 is an integral cylinder and equivalent electromagnetic lenses are manufactured, there are cases where the magnetic field strength distribution is not uniform along the central Z axis, and the magnetic field vector is distorted from the Z axis. For example, variation of the magnetic field strength may be approximately plus or minus 5%.

Therefore, a target strength is determined in advance to be a relatively weak strength around an average value, and if the strength of the divided ring magnets 202a, 202c, 202e, 202g, and 202i is higher than the average value of the parts, the nonmagnetic ring plates 202b, 202d, 202f, and 202h are sandwiched between joint portions, whereas when the strength is weaker than the average value, the ferromagnet ring plates 202b, 202d, 202f, and 202h are sandwiched between the joint portions in a direction to strengthen the magnetic field.

Further, if a magnetic field vector toward the Z axis is tilted, by assembling the individual divided ring magnets 202a, 202c, 202e, 202g, and 202i while rotating them, the magnetic field strength obtained by summing the five divided ring magnets 202a, 202c, 202e, 202g, and 202i becomes closer to the target value, and the configuration can be assembled such that the magnetic field vector along the central Z axis direction becomes closest to a straight line.

In order to smooth the non-uniformity in the axial symmetry of the magnetic field along the Z axis direction, the ring permanent magnet 202; that is, the magnets 202a, 202c, 202e, 202g, and 202i, may be vertically sandwiched between thin ferromagnetic circular plates made of, for example, permalloy, pure iron, or permendur (also referred to as permendur).

The remainder of the configuration is similar to that of the third embodiment, and the same effect can be obtained.

Fifth Embodiment

A fifth embodiment will now be described by reference to FIG. 15.

In this embodiment, a thin-walled ferromagnetic ring 211 is located on the sample 207 side of a cylindrical permanent magnet 212 which forms the electron lens; that is, the end surface on the electron beam emission side. In particular, although, in this example, the inner diameter of the ferromagnetic ring 211 is almost the same as that of the cylindrical permanent magnet 212, its outer diameter is smaller than the outer diameter of the cylindrical permanent magnet 212, and the width of the ferromagnetic ring 211 in the radial direction is approximately one-third the width of the cylindrical permanent magnet 212 in the radial direction. In this example, the outer diameter of the ferromagnetic ring 211 is almost the same as the inner diameter of a cylindrical permanent magnet 213, which will be described later.

The ferromagnetic ring 211 is a thin-walled ferromagnetic ring which is used to make a uniform magnetic field and protect the lens characteristics from the adverse effect caused by the axially asymmetric magnetic field generated around the Z axis by the cylindrical permanent magnet 212.

In the electron lens utilizing the permanent magnet, it is necessary to reduce a spherical aberration coefficient of the lens by generating a strong magnetic field in the immediate vicinity of the surface of the sample 207 on which drawing is performed. This is because, in order to reduce the aberration caused by Coulomb repulsion, it is necessary to provide a large convergence half angle $\alpha$ of a beam, and, normally, if $\alpha$ is a value as large as approximately 10 mrad, the beam defocus remains a value as small as approximately 10 nm even if a large sample current value of 300 nA is adopted.

In order to do this, a strong magnetic field of greater than 4000 Gauss has to be generated at a height of approximately 10 mm above the surface of the sample 207 to make the spherical aberration coefficient less than or equal to 10 mm. In order to form such a strong magnetic field along the axial direction, the cylindrical permanent magnet 212 has to be made of samarium cobalt polarized along the axis direction and has a hole diameter (inner diameter) smaller than or equal to 6 mm.

Further, the cylindrical permanent magnet 213 serving as an electron lens having a large hole diameter (large inner diameter) is installed along the electron beam incoming direction (incoming side) so that the polarity is opposite that of the cylindrical permanent magnet 212.

Figure 15:
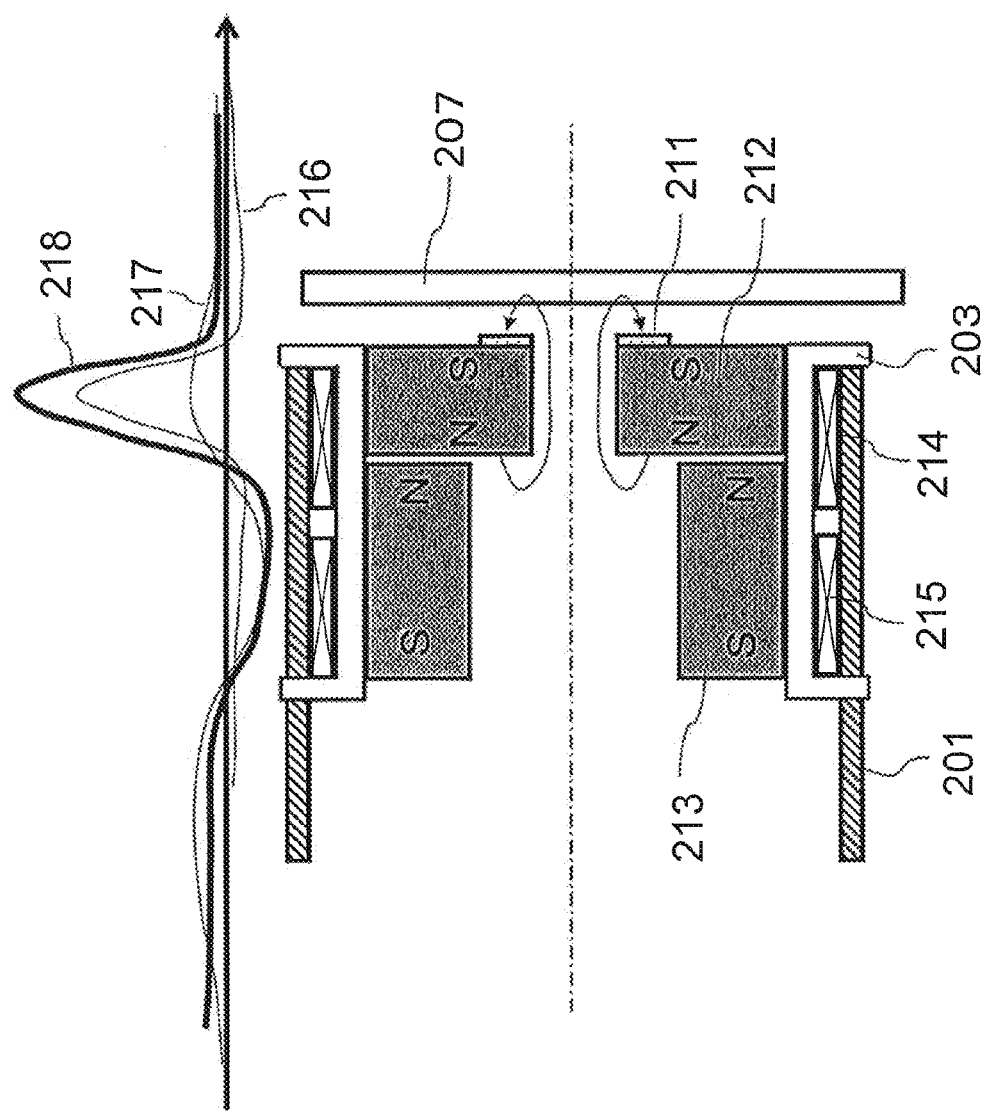
FIG. 15 illustrates a fifth embodiment of the electron lens of the present invention.

The magnetic field curves obtained by this configuration are shown on the upper side of FIG. 15. A magnetic field distribution curve 216 is obtained by the cylindrical permanent magnet 212 serving as a main permanent magnet. Meanwhile, a magnetic field generated by the cylindrical permanent magnet 213 serving as a sub electron lens resembles a magnetic field distribution curve 217. Therefore, a magnetic field obtained by an electron lens generated by adding the two curves; that is, by combining the two cylindrical permanent magnets 212 and 213, has a local maximum value in the magnetic field portion immediately above the surface of the sample 207, like a magnetic field distribution curve 218. As, in the Z direction, an integrated value of a square of the magnetic field along the Z direction is equal to the lens strength, it is possible to obtain a small spherical aberration due to the strong magnetic field immediately above the surface of the sample 207.

Therefore, in the present embodiment, as the inner diameter of the main permanent magnet lens is greater than or equal to 8 mm, it is possible to achieve a lens which has a beam convergence half angle α of 10 mrad with a small change in the depth of beam focus due to the Coulomb effect, a spherical aberration coefficient of 10 nm, and a spherical aberration of approximately 10 nm. If the permanent magnet lenses (cylindrical permanent magnets 212 and 213) have a small inner diameter, a deflector cannot be installed. Therefore, the inner diameter is preferably as large as possible.

As described above, because, in the present embodiment, the ferromagnetic ring 211 is provided on the end surface of the cylindrical permanent magnet 212 facing the sample 207, it is possible to make a uniform magnetic field immediately above the sample 207 in the circumferential direction, thereby obtaining an electron lens with high accuracy.

As described above, with the present embodiment, there is realized a low aberration lens with small beam defocus, which is caused by the Coulomb effect, and a small spherical aberration coefficient, and this lens contributes to the high resolution in the electron beam exposure device.

Further, in the present embodiment, correction coils 214 and 215 for correcting the magnetic field strength of the permanent magnets are installed immediately inside the cylindrical ferromagnet 201. Although, in this example, the correction coils 214 and 215 are provided so as to correspond to the cylindrical permanent magnets 212 and 213, respectively, and the respective correction coils generate appropriate correction magnet fields, one or more than two correction coils may be provided. The flanged inner cylindrical member (coolant passage) 203 is also formed so as to prevent heat generated by the correction coils 214 and 215 from being transmitted to the cylindrical permanent magnets 212 and 213. As described above, the cylindrical permanent magnets 212 and 213 may have a configuration formed of a plurality of divided pieces or a configuration having the magnetic material inside.

Figure 16:
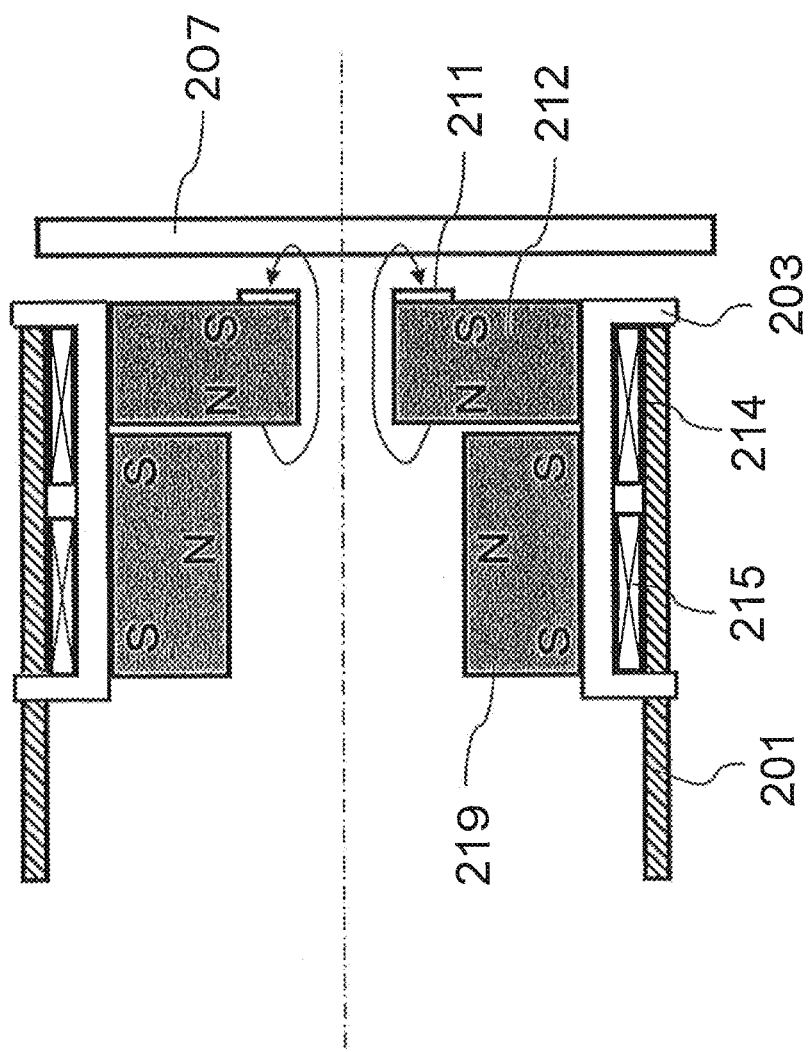
FIG. 16 illustrates a variant of the fifth embodiment of the electron lens of the present invention.

FIG. 16 shows a variant of the fifth embodiment. In this example, a cylindrical permanent magnet 219 polarized along the radial direction is provided in place of the above-described cylindrical permanent magnet 213. This cylindrical permanent magnet 219 is polarized along the radial direction so that the magnetic field generated on the cylindrical permanent magnet 212 side can be a magnetic field that strengthens the main-lens magnetic field of the cylindrical permanent magnet 212. With this configuration, it is also possible to strengthen the magnetic field in the vicinity of an electron beam emitting portion.

INDUSTRIAL APPLICABILITY

Figure 5:
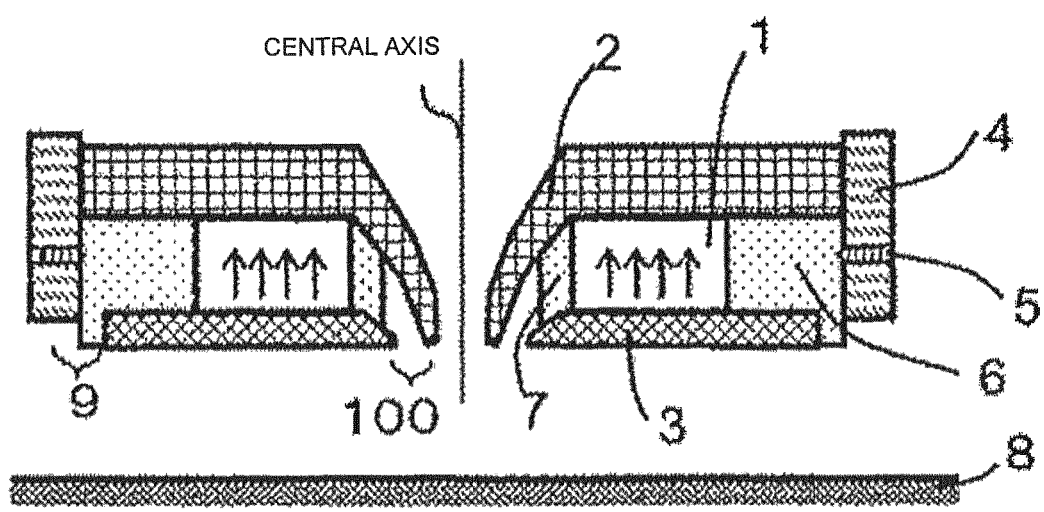
FIG. 5 shows an electron lens disclosed in Patent Literature 1, JP 2007-311117 A.

The multicolumn electron beam drawing device is the most likely technology to expose an LSI pattern of a line width of 15 nm to 10 nm, which will be required in the years 2015 to 2020, at a processing capacity of approximately 10 sheets to more than approximately 20 sheets of 300 mm wafers per hour. Other proposed technologies such as, for example, an extremely short ultraviolet exposure device are likely to have a processing capacity of approximately only one sheet per hour. Further, because, in the electron beam drawing device, an LSI pattern having a line width of approximately 15 nm to approximately 10 nm can be exposed using only photoresist (photosensitive substance) having a sensitivity lower than 100 $\mu C/cm^2$, in the multibeam system other than the multicolumn system, a beam is defocused by a large current caused by inter-electron interaction, and therefore, only a current value of approximately several microamperes per column can be used. As the 300 mm wafer has an area of approximately 600 square centimeters, an exposure time of more than 60,000 seconds is required. With more than several dozens of columns, it is possible to reduce this time to approximately 600 seconds or less. In addition, with CP (character projection) described in FIG. 5, it is possible to perform description at a pattern having an average filling rate of approximately 20% or less. In other words, exposure is likely to be performed within approximately 120 seconds or less. This corresponds to a processing capacity of more than 20 sheets per hour.

In order to perform exposure processing on the 300 mm diameter silicone wafer with more than several dozens of columns in a parallel manner, the thickness of a column element is estimated. In this case, the diameter of the thickness of the column element has to be smaller than or equal to 25 mm.

Further, although, with the method disclosed in Patent Literature 1, it is impossible to arrange several to more than ten columns above one wafer, the column according to the present invention can be made 25 mm or smaller, which is a fraction of the size of the conventional column, and therefore, it is possible to arrange several dozens to one hundred multiple columns for providing lenses.

For the above reasons, the present technology is considered to be essential in the configuration of the multicolumn electron beam drawing device and greatly contribute to the electronic industry as a technology providing practical use of the multicolumn electron beam drawing device and playing a central role of the next generation fine lithography.

REFERENCE SIGNS LIST

101 Relay magnet composed of a thin-walled cylindrical ferromagnet located as an outer circumference
102 Thin-walled cylindrical permanent magnet
103 Relay magnet composed of a thin-walled cylindrical ferromagnet located as an inner circumference
104 Magnetic flux
105 Circular plate relay magnet composed of an upper ferromagnet
106 Circular plate relay magnet composed of a lower ferromagnet
107 Upper correction magnet coil
108 Lower correction magnet coil
109 O-ring
110 Magnetic flux density distribution
112 Upper thin-walled cylindrical permanent magnet
113 Relay magnet composed of a thin-walled cylindrical ferromagnet located as an upper inner circumference
114 Upper correction magnet coil
115 Middle correction coil magnet
116 Lower correction magnet coil
122 Lower thin-walled cylindrical permanent magnet
123 Relay magnet composed of a thin-walled cylindrical ferromagnet located as a lower inner circumference
131 Vacuum seal cylinder
132 Flourinert for cooling
201 Outer cylinder
202 Permanent magnet
203 Flanged inner cylindrical member
204 Correction coil
205 Stig coil
207 Drawing sample or silicone wafer 211 Ferromagnetic ring
212,213 Cylindrical permanent magnet
214,215 Correction coil
216 Magnetic field distribution curve generated by the cylindrical permanent magnet 212 along the axial direction
217 Magnetic field distribution curve generated by the cylindrical permanent magnet 213 along the axial direction
218 Magnetic field distribution curve generated by a sum of the cylindrical permanent magnet 212 and the cylindrical permanent magnet 213 along the axial direction
219 Other cylindrical permanent magnet
301 Single electron beam column
302 Multiple electron beam column
303 Semiconductor wafer
304 Electron gun
305 First rectangular aperture
306 Rectangular-shaping deflector
307 Electromagnetic lens
308 Second rectangular aperture
309 Positioning deflector
601 Suppressor electrode
602 Extraction electrode
603 Lens electrode
604 Anode (earth potential)
605 First rectangular aperture
606 Second rectangular aperture
607 Round aperture
608 Positioning deflector
609 Sample (Si wafer)
610 Blanking electrode
611a Rectangular-shaping deflector 1
611b Rectangular-shaping deflector 2
621 Projection lens
622 Electron lens
623, 624 Reducing lens
625 Projection lens
631a, 631b to 635a, 635b Correction coil

The invention claimed is:

1. An electron beam device having a plurality of electron lenses arranged on a plane generally orthogonal to a Z axis, and emitting a plurality of electron beams to a sample, the electron beams emitted in the Z axis direction from electron guns, wherein each electron lens comprises:
   an outer tube composed of a tubular ferromagnet with the Z axis as a central axis;
   a tubular permanent magnet located inside the outer tube and polarized along the Z axis direction, the electron beam passing through;
   the tubular permanent magnet generating a magnetic field greater than 4000 Gauss immediately above the surface of the sample and focusing the electron beam to the surface of the sample;
   a ferromagnetic ring which is thinner than the tubular permanent magnet in the z axis direction and homogenizes the magnetic field generated by the tubular permanent magnet is located between the tubular permanent magnet and the sample, on an end surface of an electron beam emission side of the tubular permanent magnet along the Z axis direction with an outer diameter of the ferromagnetic ring being smaller than the outer diameter of the tubular permanent magnet and the inner diameter of the ferromagnetic ring is the same as the inner diameter of the tubular permanent magnet; and
   the electron lens is a final lens for the electron beam that is emitted to the sample.

2. The electron beam device according to claim 1, wherein a width of the ferromagnetic ring in the radial direction is one-third of a width of the tubular permanent magnet in the radial direction.

3. The electron beam device according to Claim 1, each electron lens comprising,
   a correction coil located inside or outside the tubular permanent magnet with a gap from the tubular permanent magnet, for adjusting a magnetic field strength generated by the tubular permanent magnet along the Z axis direction; and
   a coolant passage located in the gap between the tubular permanent magnet and the correction coil, for allowing a coolant to flow therethrough and controlling temperature changes in the tubular permanent magnet.

4. The electron beam device according to claim 1, wherein:
   the electron lenses are aligned along an X axis direction and a Y axis direction which are generally orthogonal to the Z axis direction such that a plurality of lenses are arranged at regular intervals with a pitch PX along the X axis direction, while a plurality of lenses are arranged at regular intervals with a pitch PY along the Y axis direction; and
   a temperature is controlled by causing a liquid or gas coolant to flow in each electron lens.

* * * * *